US012709540B2

(12) United States Patent
Martini et al.

(10) Patent No.: US 12,709,540 B2
(45) Date of Patent: Aug. 18, 2026

(54) MULTI-LEVEL MEMS PROCESS

(71) Applicant: InvenSense, Inc., San Jose, CA (US)

(72) Inventors: Roberto Martini, Milan (IT); Matthew Julian Thompson, Beaverton, OR (US); Giacomo Gafforelli, Casatenovo (IT); Luca Coronato, Corsico (IT); Luigi Esposito, Bologna (IT)

(73) Assignee: InvenSense, Inc., San Jose, CA (US)

( * ) Notice: Subject to any disclaimer, the term of this patent is extended or adjusted under 35 U.S.C. 154(b) by 461 days.

(21) Appl. No.: 18/136,556

(22) Filed: Apr. 19, 2023

(65) Prior Publication Data

US 2024/0351864 A1 Oct. 24, 2024

(51) Int. Cl.
*B81C 1/00* (2006.01)
*B81B 3/00* (2006.01)

(52) U.S. Cl.
CPC ........ *B81C 1/00349* (2013.01); *B81B 3/0018* (2013.01); *B81B 2201/0235* (2013.01); *B81B 2203/0109* (2013.01); *B81B 2203/03* (2013.01); *B81B 2203/04* (2013.01); *B81C 2201/0109* (2013.01); *B81C 2201/0132* (2013.01); *B81C 2201/0147* (2013.01)

(58) Field of Classification Search
CPC ............ B81C 1/00349; B81C 1/00182; B81C 2201/0109; B81C 2201/0132; B81C 2201/0147; B81C 2201/0187; B81C 2201/019
See application file for complete search history.

(56) References Cited

U.S. PATENT DOCUMENTS

2014/0227817 A1* 8/2014 Chien .................. B81C 1/0023 438/51
2014/0239423 A1* 8/2014 Liu .................... B81C 1/00793 438/51
2016/0187370 A1 6/2016 Ikehashi
2016/0280534 A1 9/2016 Stahl et al.
2021/0221677 A1* 7/2021 Shao .................. B81C 1/00182
2021/0396616 A1 12/2021 Nagel
2024/0158223 A1* 5/2024 Walton ................. B81B 3/0043

* cited by examiner

*Primary Examiner* — Moazzam Hossain
(74) *Attorney, Agent, or Firm* — Van Hoven PC; Joshua Van Hoven

(57) ABSTRACT

An actuator layer of a MEMS sensor is be fabricated to include multi-level features, such as additional sense electrodes, vertical bump stops, or weighted proof masses. A sacrificial layer is deposited on the actuator layer such that locations are provided for the multi-level features to extend vertically from the actuator layer. After the multi-layer features are fabricated on the actuator layer the sacrificial layer is removed. Additional processing such as patterning of the actuator layer may be performed to provide desired functionality and electrical signals to portions of the actuator layer, including to the multi-level features.

18 Claims, 14 Drawing Sheets

MULTI-LEVEL MEMS PROCESS

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions). As MEMS sensors are utilized to capture complex movements in a wide variety of applications, there are limitations on the space that can be utilized for design of MEMS geometries.

SUMMARY

In an embodiment of the present disclosure, a method of fabricating a multi-level microelectromechanical system (MEMS) sensor comprises providing an actuator layer; applying a sacrificial layer to a first surface of the actuator layer, wherein one or more openings within the sacrificial layer correspond to one or more multi-level features, and fabricating the one or more multi-level features on the actuator layer, wherein the one or more features extend from the first surface actuator layer through the one or more openings in the sacrificial layer. The method may further comprise removing the sacrificial layer and bonding a handle layer to the actuator layer.

In an embodiment of the present disclosure, a multi-level microelectromechanical system (MEMS) sensor, comprises an actuator layer, wherein the actuator includes a first planar surface and a second planar surface, and a plurality of multi-level features extending from the first planar surface. The MEMS sensor may further comprise a handle layer facing the first planar surface and bonded to the actuator layer and a substrate layer facing the second planar surface and bonded to the actuator layer.

In an embodiment of the present disclosure, a method for sensing acceleration with a multi-level microelectromechanical system (MEMS) sensor, comprises receiving a first sense signal representative of a first capacitance between a first planar surface of an actuator layer and a sense electrode of a multi-level feature that faces the first planar surface. The method may further comprise receiving a second sense signal representative of a second capacitance between a second planar surface of the actuator layer and a substrate layer that faces the second planar surface, wherein the second parallel surface is parallel to the first planar surface on an opposite side of the actuator layer, and wherein the multi-level feature extends from the actuator layer. The method may further comprise determining, by processing circuitry, the acceleration based on the first sense signal and the second sense signal.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION

A MEMS sensor such as a MEMS accelerometer, gyroscope, pressure sensor, or microphone is typically fabricated of multiple layers that are individually processed (e.g., as separate wafers) to create desired mechanical geometries, electrical connections, and electrical processing. The layers (e.g., as wafers) are then bonded together to create the finalized MEMS components (e.g., by dicing the bonded wafers). A MEMS layer (e.g., a MEMS actuator layer) may generally include the components and geometries that respond to a force of interest such as linear acceleration, angular velocity, or pressure, such as by moving within the actuator layer (e.g., in-plane movement) or out of the plane of the actuator layer (e.g., out-of-plane movement). The actuator layer is bonded to a cap layer (e.g., a handle layer) and to a substrate layer, which also provides electrical connections to portions of the actuator layer (e.g., from electrical processing circuitry of the substrate layer or handle layer).

More complex geometries can be created on the actuator layer via the fabrication of multi-level features on the actuator layer. The actuator layer may initially have two parallel planar surfaces. A sacrificial material is deposited on one of the planar surfaces to define regions on the actuator layer where the multi-level features will be formed. The multi-level features are fabricated (e.g., grown) on the regions of the actuator layer and over the sacrificial layer, creating features that extend from the actuator layer and in some embodiments hang over the actuator layer parallel to the planar surface. In some instances, posts can additionally be fabricated (e.g., grown via a dielectric mask) from the actuator layer for bonding to the handle layer. Additional processing is performed on the other side of the actuator layer from where the multi-level MEMS features were formed, such as to prepare the actuator layer for bonding to the substrate layer and to electrically separate portions of the actuator layer (e.g., including the multi-level features) from each other.

Multi-level features facilitate a number of useful geometries for a MEMS sensor. For example, a multi-level feature located over a portion of the actuator layer corresponding to a proof mass may provide for differential sensing of out-of-plane movement of the proof mass, for example, relative to an underlying sense electrode on the substrate layer. A multi-level feature can also function as a vertical bump stop, preventing damage of the MEMS sensor due to large out-of-plane movements of the proof mass. A multi-level sensor may also provide weighting to a portion of a proof mass of the actuator layer, facilitating movement of the proof mass in response to a force of interest. A multi-level sensor may also allow the creation of bridges between parts of the MEMS that would be otherwise impossible to connect because obstructed by other features on the actuator level.

Figure 1:
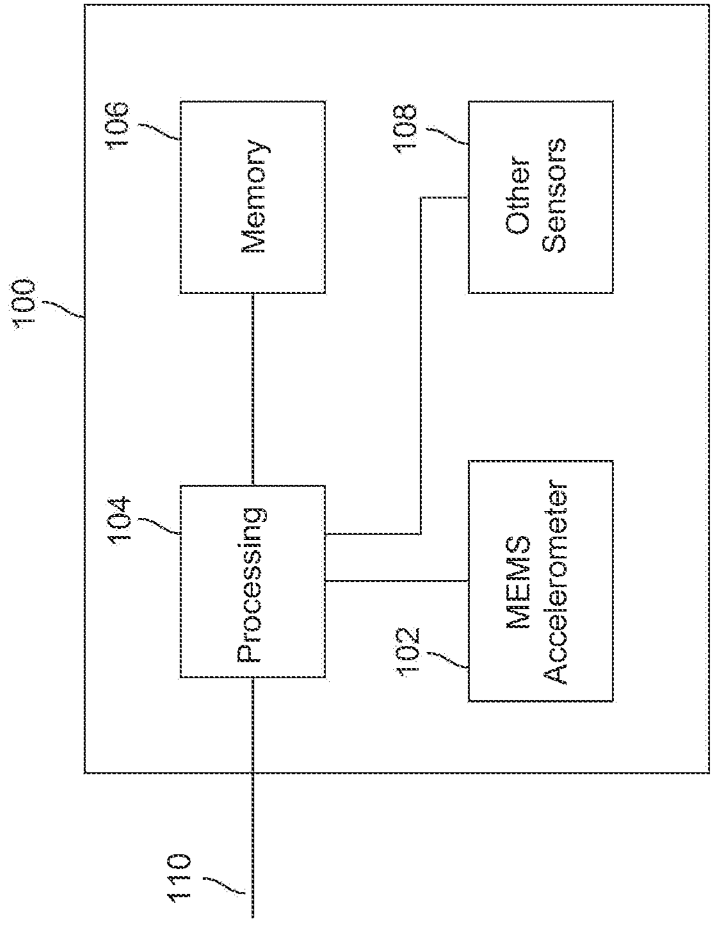
FIG. 1 shows an illustrative MEMS system in accordance with an embodiment of the present disclosure.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In accordance with the present disclosure, the MEMS system may include a MEMS sensor 102 as well as additional sensors 108. In an embodiment, the MEMS sensor 102 and/or any of the additional sensors may be fabricated with multi-level features on the actuator layer, facilitating a variety of useful features for MEMS sensors such as out-of-plane sensors, including differential out-of-plane sensing, vertical bump stops for in-plane or out-of-plane sensors, and weighted in-plane or out-of-plane proof masses.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS sensor 102 or other sensors 108, or on an adjacent portion of a chip to the MEMS sensor 102 or other sensors 108) to control the operation of the MEMS sensor 102 or other sensors 108 and perform aspects of processing for the MEMS sensor 102 or the other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS sensor 102 by interacting with the hardware control logic and processing signals received from MEMS sensor 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors

108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art). The processing circuitry 104 may convert signals received from the MEMS sensor 102 and other sensors 108 into appropriate measurement units (e.g., based on settings provided by other computing units communicating over the communication interface 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor 102 or other sensors 108.

In some embodiments, certain types of information may be determined based on data from multiple MEMS gyroscopes 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

FIGS. 2A-G shows illustrative steps of a fabrication procedure for a multi-level MEMS sensor 200 in accordance with an embodiment of the present disclosure. Although particular steps are depicted in certain configurations for FIGS. 2A-2G, steps may be removed, modified, or substituted and additional steps may be added in certain embodiments.

Figures 2A, 2B, 2C, 2D:
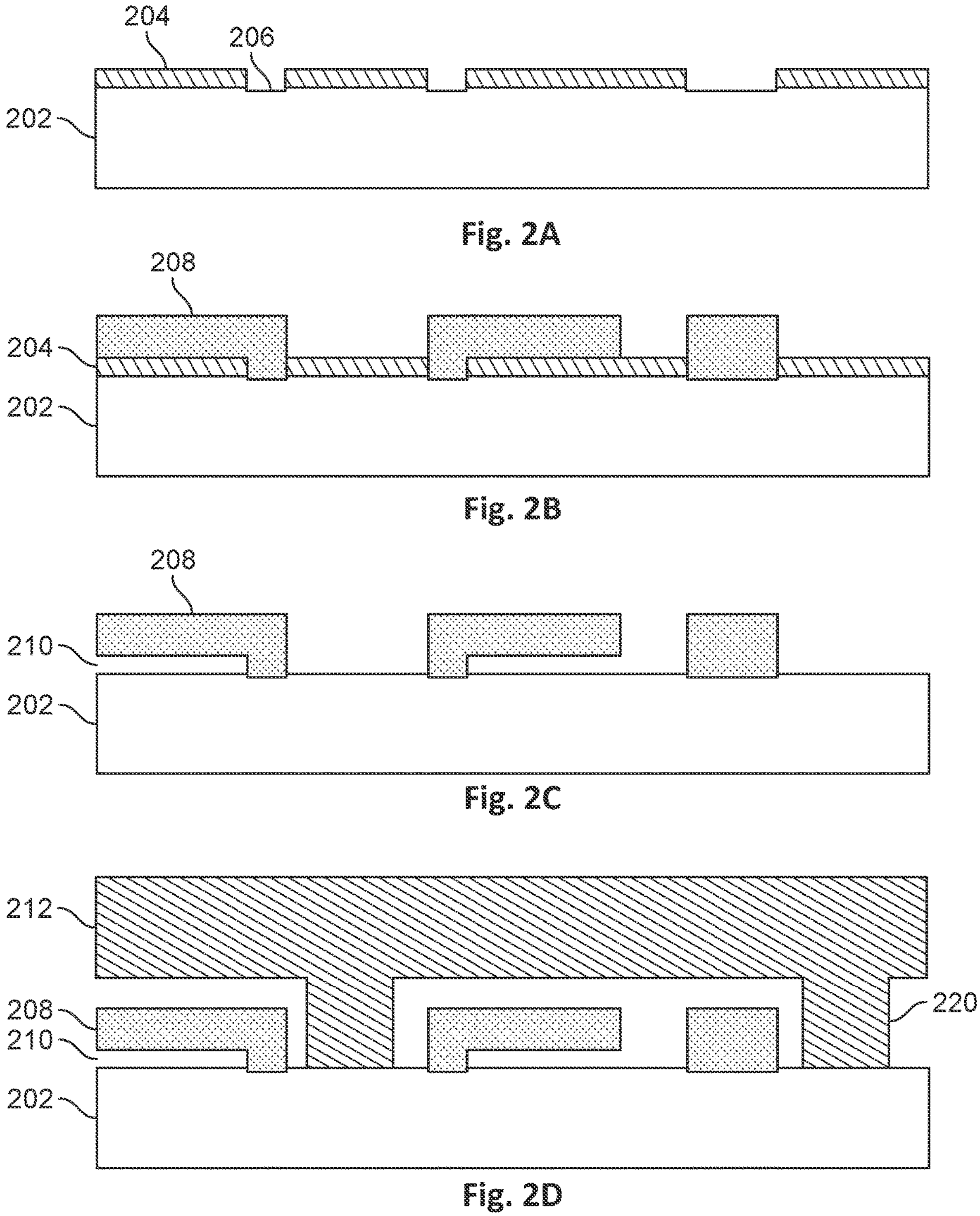
FIG. 2A depicts a step of a process for fabricating a multi-level MEMS sensor, including providing a sacrificial layer on a first surface of an actuator layer, in accordance with an embodiment of the present disclosure.
FIG. 2B depicts a step of a process for fabricating a multi-level MEMS sensor, including fabricating multi-level features, in accordance with an embodiment of the present disclosure.
FIG. 2C depicts a step of a process for fabricating a multi-level MEMS sensor, including removing a sacrificial layer, in accordance with an embodiment of the present disclosure.
FIG. 2D depicts a step of a process for fabricating a multi-level MEMS sensor, including bonding a handle layer to an actuator layer, in accordance with an embodiment of the present disclosure.

FIG. 2A depicts a step of a process for fabricating a multi-level MEMS sensor, including providing a sacrificial layer on a first surface (e.g., a planar surface) of an actuator layer, in accordance with an embodiment of the present disclosure. FIG. 2A begins the fabrication procedure with an actuator layer 202 (e.g., a silicon or doped silicon wafer) over which a sacrificial layer 204 (e.g., silicon oxide) is deposited and openings within the sacrificial layer 206 have been patterned. The sacrificial layer 204 includes openings 206 based on the patterning that correspond to locations where additional layers of material will be fabricated on the actuator layer to form a multi-level actuator layer. The locations and relative sized depicted for openings 206 are exemplary only, and will be dependent on the particular multi-level structures being formed. Although depicted showing a single portion of an actuator layer 202, it will be understood that the actuator layer may initially be part of a wafer which may later be diced into individual MEMS devices once fabricated.

FIG. 2B depicts a step of a process for fabricating a multi-level MEMS sensor, including fabricating multi-level features, in accordance with an embodiment of the present disclosure. FIG. 2B proceeds to show one or more multi-level features 208 (e.g., on the actuator layer) that extend from a first surface of the actuator layer 202 through the one or more openings within the sacrificial layer 206. In some embodiments, the one or more multi-level features 208 are fabricated on the actuator layer 202 by epitaxial growth of the material composing the actuator layer 202 (e.g., silicon or doped silicon) to form a mechanical and electrical connection with actuator layer 202. In some embodiments, the one or more multi-level features 208 are patterned, such as by using deep reactive-ion etching. For example, the material of the multi-level features may initially be grown over the entirety of the sacrificial layer 206 and the exposed portions of the actuator layer 202 (not depicted) and then further patterned to form multiple multi-level features 208. The multi-level features 208 enhance the performance of the multi-level MEMS sensor 200 by the enablement of qualities such as increased measurement sensitivity, better protection of inertial components, increased sensor density, and improved rejection of noise, offset, and drift. Although depicted showing a few topologies of the multi-level features 208, it will be understood that the multi-level features 208 embody any multi-level actuator layer fabricated with one or more feature topologies and composing one or more levels above the actuator layer 202.

FIG. 2C depicts a step of a process for fabricating a multi-level MEMS sensor, including removing a sacrificial layer, in accordance with an embodiment of the present disclosure. FIG. 2C proceeds to show isolation of the one or more multi-level features 208 by etching of the sacrificial layer 204, resulting in the intra-layer cavity 210 between the actuator layer 202 and the one or more multi-level features 208. Examples of multi-level features 208 include an overhanging structure (e.g., top electrode, vertical flexible bump stop, or bridging mass) or a bulk solid (e.g., additional sense mass or bonding post). The etching process (e.g., wet chemical etch) selectively removes the sacrificial layer 204 without affecting the actuator layer 202 or the one or more multi-level features 208. Feature isolation within the original actuator layer portion depicted and described below (e.g., at FIG. 2F) effectively decouples one or more of the one or more multi-level features 208 from other multi-level features 208, with regards to the mechanical and/or electrical connection to the actuator layer 202 and other layers connected via the actuator layer 202 (e.g., a substrate layer 218). Feature isolation via intra-layer cavities 210 enables the fabrication of a multi-level MEMS sensor 200 with a plurality of overhanging structures and/or bulk solids, a plurality of improved sensor qualities, and the ability to integrate these features within individual MEMS devices. In some embodiments, not depicted herein, the processes of FIGS. 2A-2C may be repeated to form additional layers of multi-level features, for example, resulting in three or more layers of multi-level features.

FIG. 2D depicts a step of a process for fabricating a multi-level MEMS sensor, including bonding a handle layer to an actuator layer, in accordance with an embodiment of the present disclosure. FIG. 2D proceeds to show the bonding of a handle layer 212 (e.g., silicon) to the first surface of the actuator layer 202. In some embodiments, the handle layer 212 is bonded to the actuator layer 202, such as by using fusion bonding. In some embodiments, handle layer posts 220 extend vertically from the surface of the handle layer 212 to the actuator layer 202 such as to provide the mechanical interface for interlayer bonding. Although depicted showing a single portion of the bonding of a handle layer 212 with two connections to the first surface of the actuator layer 202, it will be understood that the interlayer bonding embodies any number of connections to the individual MEMS device and/or the wafer comprising individual MEMS devices. The handle layer 212 provides a cavity surrounding the multi-level actuator layer, which may provide an optimal environment operation (e.g., an ambient pressure or vacuum) for the of inertial mechanical components composing the multi-level actuator layer.

Figure 2E:
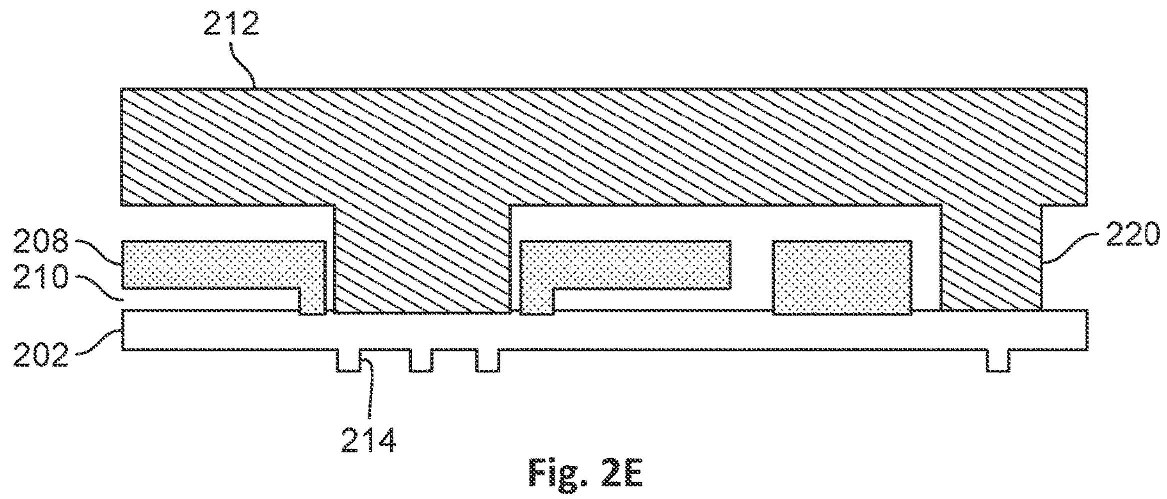
FIG. 2E depicts a step of a process for fabricating a multi-level MEMS sensor, including grinding and patterning a second surface of an actuator layer, in accordance with an embodiment of the present disclosure.

FIG. 2E depicts a step of a process for fabricating a multi-level MEMS sensor, including grinding and patterning a second surface of an actuator layer, in accordance with an embodiment of the present disclosure. FIG. 2E proceeds to show the patterning of a second surface of the actuator layer 214, for example, a second planar surface opposite the first planar surface that the multi-level features 208 were formed upon. In some embodiments, the patterned second surface of the actuator layer 214 is patterned, such as by using deep reactive-ion etching. In some embodiments, the features of the patterned second surface of the actuator layer 214 provide standoff connections to additional layers (e.g., a substrate layer providing connections to electrical signal paths) subsequently bonded to the patterned second surface of the actuator layer 214, such as for mechanical and/or electrical connection. Although depicted showing a few topologies of the patterned second surface of the actuator layer 214, it will be understood that the patterned second surface of the actuator layer 214 embodies any patterned topologies. The patterned second surface of the actuator layer 214 may subsequently form a mechanical and/or electrical connection to a substrate layer 218 (e.g., a CMOS substrate layer or a substrate layer otherwise providing electrical interconnects to active electrical components) bonded to the patterned second surface of the actuator layer 214.

Figure 2F:
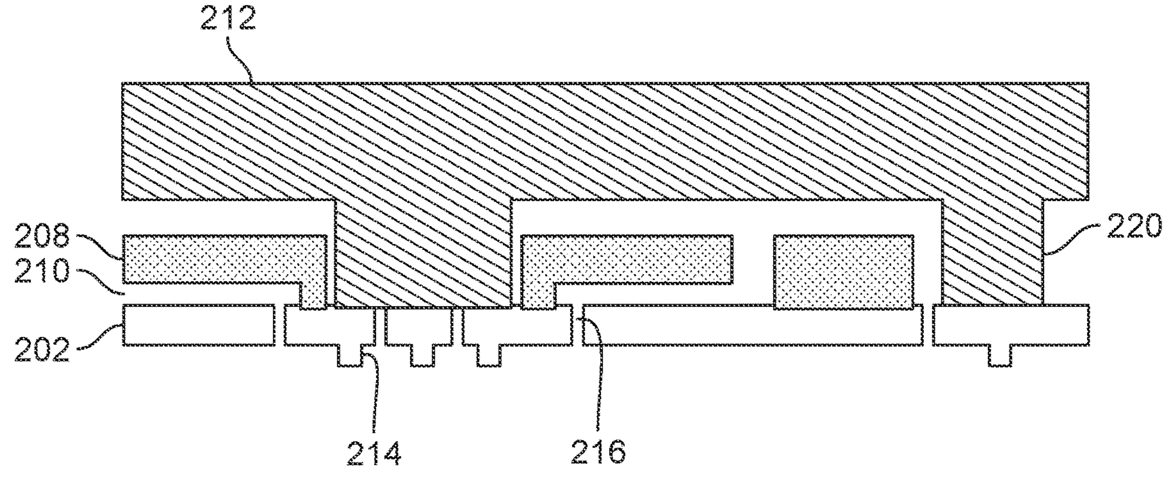
FIG. 2F depicts a step of a process for fabricating a multi-level MEMS sensor, including patterning via a second surface of an actuator layer, in accordance with an embodiment of the present disclosure.

FIG. 2F depicts a step of a process for fabricating a multi-level MEMS sensor, including patterning via a second surface of an actuator layer, in accordance with an embodiment of the present disclosure. FIG. 2F proceeds to show removed actuator material 216 (e.g., for isolation of features of the patterned second surface of the actuator layer 214). In some embodiments, removed actuator material 216 is removed, such as by using deep reactive-ion etching. Although depicted showing a few topologies of the removed actuator material 216, it will be understood that the removed actuator material 216 embodies any selective removal of a portion of the material of the patterned second surface of the actuator layer 214. Removed material decouples one or more of the one or more features of the patterned second surface of the actuator layer 214 from other features of the patterned second surface of the actuator layer 214, with regards to mechanical and/or electrical connections to the patterned second surface of the actuator layer 214.

Figure 2G:
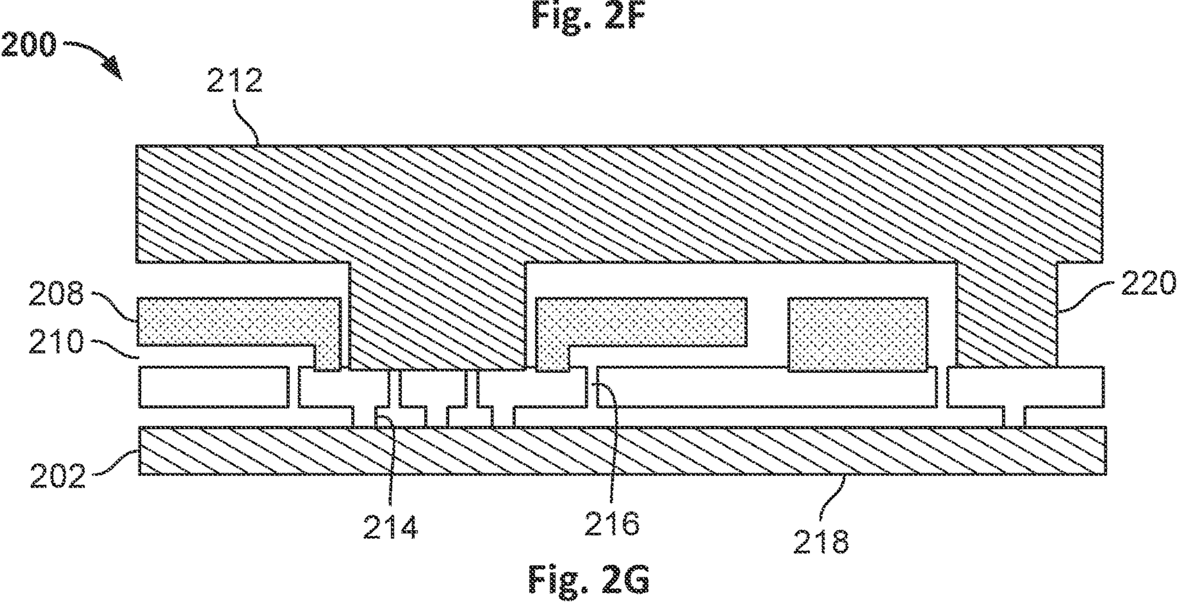
FIG. 2G depicts a step of a process for fabricating a multi-level MEMS sensor, including bonding to a substrate layer, in accordance with an embodiment of the present disclosure.

FIG. 2G depicts a step of a process for fabricating a multi-level MEMS sensor, including bonding to a substrate layer, in accordance with an embodiment of the present disclosure. FIG. 2G proceeds to show a substrate layer 218 (e.g., a CMOS substrate layer) bonded to the patterned second surface of the actuator layer 214. In some embodiments, the substrate layer 218 provides mechanical and/or electrical connections to the features of the patterned second surface of the actuator layer 214. Although depicted showing a single portion of the bonding of a substrate layer 218 to the patterned second surface of the actuator layer 214, it will be understood that the interlayer bonding embodies any number of connections to the individual MEMS device and/or the wafer comprising individual MEMS devices. The substrate layer 218 enhances the performance of the multi-level MEMS sensor 200 by the enablement of qualities such as multiplexed sensors, high-frequency signal recording, high-fidelity signal amplification, signal transposition to external devices, instantaneous system calibration, and modular performance capability.

FIGS. 3A-3I show illustrative steps of a fabrication procedure for a multi-level MEMS sensor 300 in accordance with an embodiment of the present disclosure. Although particular steps are depicted in certain configurations for FIGS. 3A-3I, steps may be removed, modified, or substituted and additional steps may be added in certain embodiments. It will be understood that certain steps in FIG. 3 relate to certain steps in FIG. 2, and any topology differences between such related steps are illustrative of various embodiments of the present disclosure and are not restrictive with respect to the embodiments illustrated therein or related embodiments that are not explicitly illustrated.

Figure 3A:
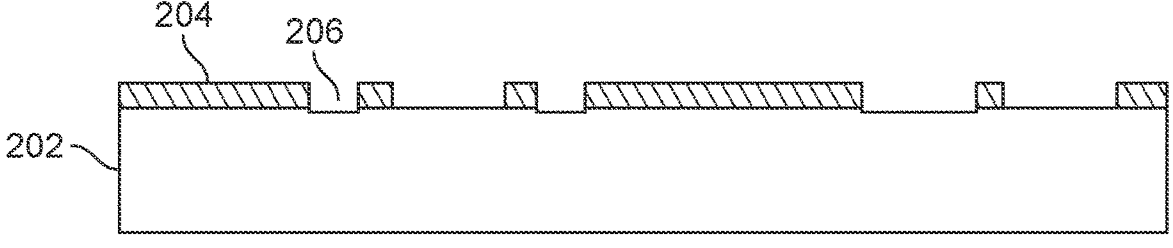
FIG. 3A depicts a step of a process for fabricating a multi-level MEMS sensor, including providing a sacrificial layer on a first surface of an actuator layer, in accordance with an embodiment of the present disclosure.
Figure 3B:
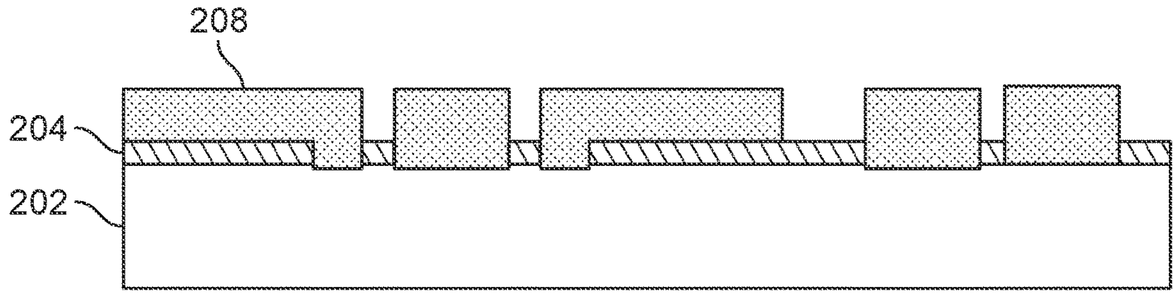
FIG. 3B depicts a step of a process for fabricating a multi-level MEMS sensor, including fabricating multi-level features, in accordance with an embodiment of the present disclosure.

FIG. 3A depicts a step of a process for fabricating a multi-level MEMS sensor, including providing a sacrificial layer on a first surface of an actuator layer, in accordance with an embodiment of the present disclosure while FIG. 3B depicts a step of a process for fabricating a multi-level MEMS sensor, including fabricating multi-level features, in accordance with an embodiment of the present disclosure. FIG. 3A and FIG. 3B begin with fabrication steps similar to those described for FIG. 2A and FIG. 2B, respectively. It will be understood that between FIGS. 3A-3B and FIGS. 2A-2B, the depicted modifications of the openings within the sacrificial layer 206 and the multi-level features 208 are included to illustrate various embodiments of the present disclosure, and features may be removed, modified, substituted, or added in certain embodiments. The locations and relative sized depicted for openings 206 are exemplary only and will be dependent on the particular multi-level structures being formed. Although depicted showing a single portion of an actuator layer 202, it will be understood that the actuator layer may initially be part of a wafer which may later be diced into individual MEMS devices once fabricated.

Figure 3C:
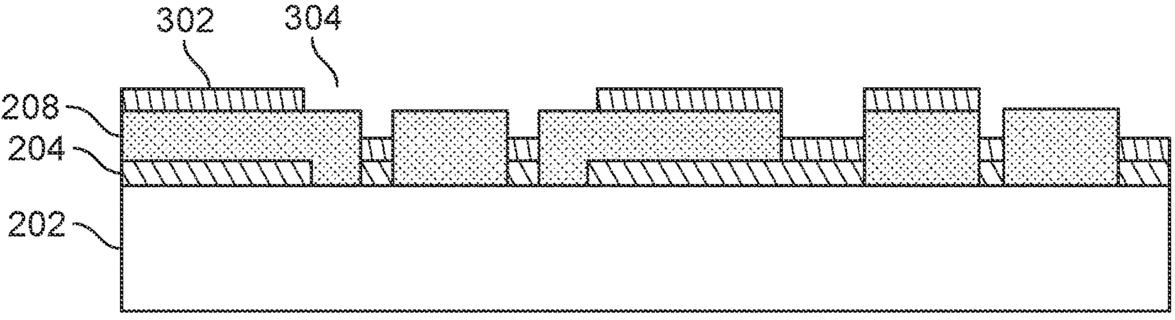
FIG. 3C depicts a step of a process for fabricating a multi-level MEMS sensor, including providing a dielectric mask for posts, over multi-level features in accordance with an embodiment of the present disclosure.

FIG. 3C depicts a step of a process for fabricating a multi-level MEMS sensor, including providing a dielectric mask for posts, over multi-level features in accordance with an embodiment of the present disclosure. FIG. 3C proceeds to show a dielectric mask layer 302 (e.g., silicon oxide or silicon nitride) applied over the multi-level features 208, and the patterning of openings 304 within the dielectric mask. In some embodiments, the openings 304 within the dielectric mask are patterned, such as by using deep reactive-ion etching. For example, the material of the multi-level features 208 may be further grown from the actuator layer 202 through the openings 304 within the dielectric mask. Arbitrarily spaced openings 304 within the dielectric mask enable the fabrication of arbitrary geometries of multi-level features 208 with one or more levels above the actuator layer 202. Although depicted showing a few openings 304 within the dielectric mask, it will be understood that these openings 304 embody any one or more openings corresponding to locations of vertical extensions of one or more multi-level features 208.

Figures 3D, 3E, 3F:
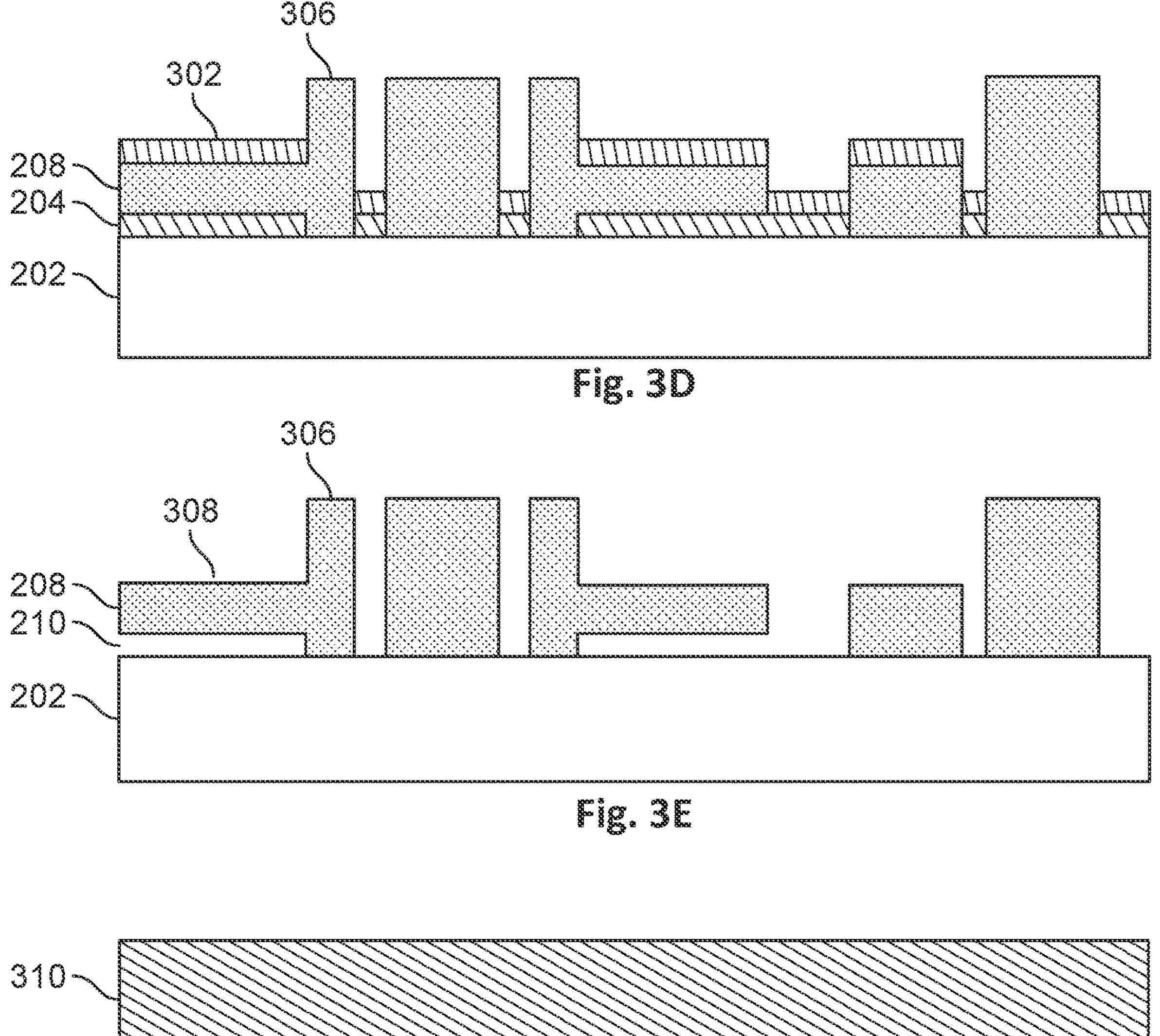
FIG. 3D depicts a step of a process for fabricating a multi-level MEMS sensor, including posts via openings in a dielectric mask, in accordance with an embodiment of the present disclosure.
FIG. 3E depicts a step of a process for fabricating a multi-level MEMS sensor, including removing a sacrificial layer and dielectric mask, in accordance with an embodiment of the present disclosure.
FIG. 3F depicts a step of a process for fabricating a multi-level MEMS sensor, including bonding a handle layer to an actuator layer via posts, in accordance with an embodiment of the present disclosure.

FIG. 3D depicts a step of a process for fabricating a multi-level MEMS sensor, including posts via openings in a dielectric mask, in accordance with an embodiment of the present disclosure. FIG. 3D proceeds to show actuator layer posts 306 grown to vertically extend from one or many multi-level features 208, at locations corresponding to the openings 304 within the dielectric mask 302. Although depicted showing a few actuator layer posts 306, it will be understood that the actuator layer posts 306 embody any one or more multi-level feature extensions that vertically extend from one or more levels of the multi-level features 208. In some embodiments, the actuator layer posts 306 are fabricated, such as by using epitaxial growth of the actuator layer material 202 composing the multi-level feature 208. The actuator layer posts 306 may enable bonding to a layer above the actuator posts 306, and may therefore obviate the need for other bond topologies (e.g., handle layer posts 220), wherein such other bond topologies may introduce challenges during fabrication, such as requiring difficult microscale alignment. In some embodiments, the actuator layer posts 306 may compose additional levels of the multi-level features 208, including structures such as overhanging structures (e.g., top electrode, vertical flexible bump stop, or bridging mass) or bulk solids (e.g., additional sense mass or bonding post). The actuator layer posts 306 may enhance the performance of the multi-level MEMS sensor 300 by the enablement of qualities such as increased measurement sensitivity, better protection of inertial components, increased sensor density, and improved rejection of noise, offset, and drift.

FIG. 3E depicts a step of a process for fabricating a multi-level MEMS sensor, including removing a sacrificial layer and dielectric mask, in accordance with an embodiment of the present disclosure. FIG. 3E proceeds to show the isolation of the actuator posts 306 and the one or more multi-level features 208 by etching of the dielectric mask layer 302 and the sacrificial layer 204 resulting in the intra-layer cavity 308 between the multi-level feature 208 and the bonding layer 310 (as described below) and the intra-layer cavity 210 between the actuator layer 202 and the one or more multi-level features 208. In some embodiments, the dielectric mask layer 302 and the sacrificial layer 204 are removed, such as by using wet chemical etching. The etching process selectively removes the dielectric mask layer 304 and the sacrificial layer 210 without affecting the geometry of actuator layer 202, the one or more multi-level features 208, or the actuator layer posts 306. Feature isolation via the intra-layer cavities 308 and 210 effectively decouples one or more of the individual features (e.g., those of 208 and/or 306) from one or more other features (e.g., those of 208 and/or 306), with regards to their mechanical and/or electrical connections to the actuator layer 202 and other layers connected via the actuator layer 202 (e.g., a substrate layer 218). In some embodiments, feature isolation enables the fabrication of a multi-level MEMS sensor 300 with a plurality of overhanging structures and/or bulk solids, a plurality of improved sensor qualities, and the ability to integrate these features within individual MEMS devices. In some embodiments, not depicted herein, the processes of FIGS. 3A-3E may be repeated to form additional layers of multi-level features and/or actuator layer posts, for example, to result in three or more layers of multi-level features and/or actuator layer posts.

FIG. 3F depicts a step of a process for fabricating a multi-level MEMS sensor, including bonding a handle layer to an actuator layer via posts, in accordance with an embodiment of the present disclosure. FIG. 3F proceeds to show the bonding of a handle layer 310 (e.g., silicon without posts) to the actuator layer posts 306. In some embodiments, the handle layer 310 is bonded, such as by using fusion bonding. Although depicted showing a single portion of the bonding of a handle layer 310 with four connections to the actuator layer posts 306, it will be understood that the interlayer bonding embodies any number of connections to the individual MEMS device and/or the wafer comprising individual MEMS devices. The handle layer 310 provides a cavity surrounding the multi-level actuator layer, which may provide an optimal environment (e.g., an ambient pressure or vacuum) for the operation of inertial mechanical components composing the multi-level actuator layer.

Figure 3G:
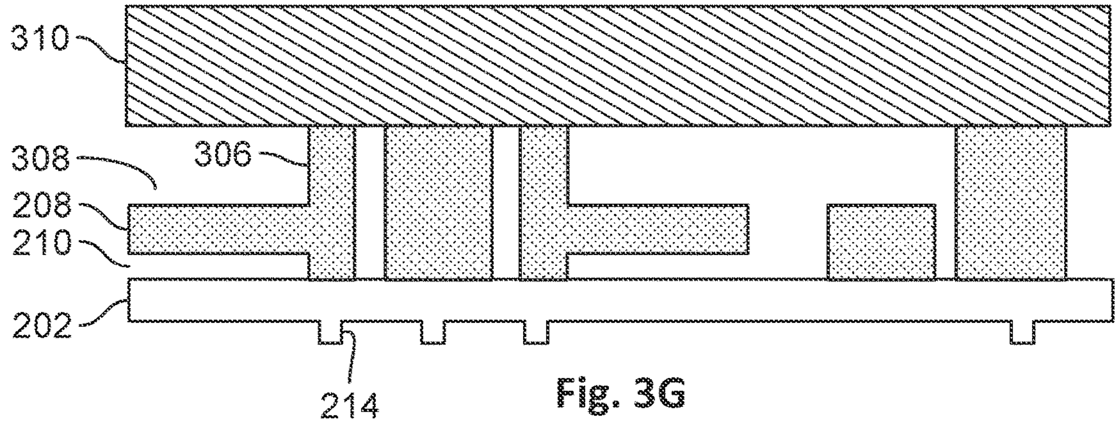
FIG. 3G depicts a step of a process for fabricating a multi-level MEMS sensor, including grinding and patterning a second surface of an actuator layer, in accordance with an embodiment of the present disclosure.
Figure 3H:
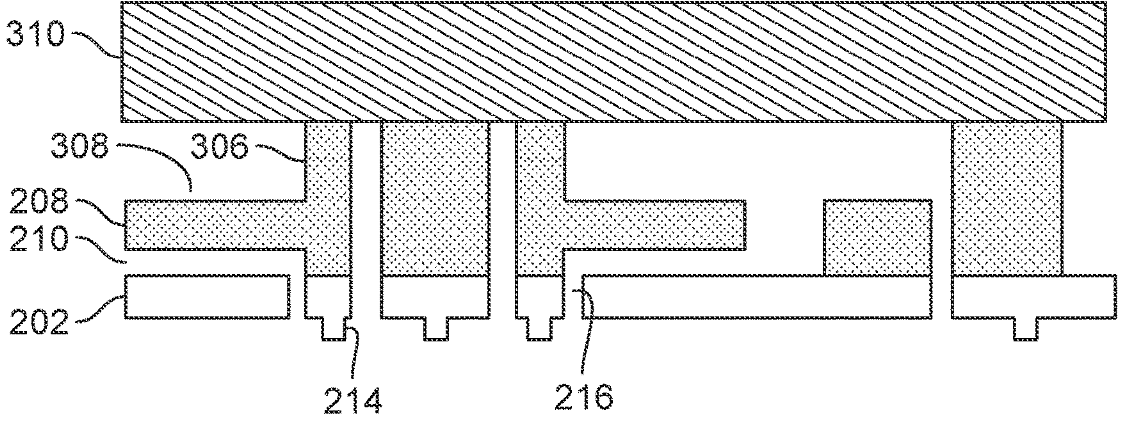
FIG. 3H depicts a step of a process for fabricating a multi-level MEMS sensor, including patterning via a second surface of an actuator layer, in accordance with an embodiment of the present disclosure.
Figure 3I:
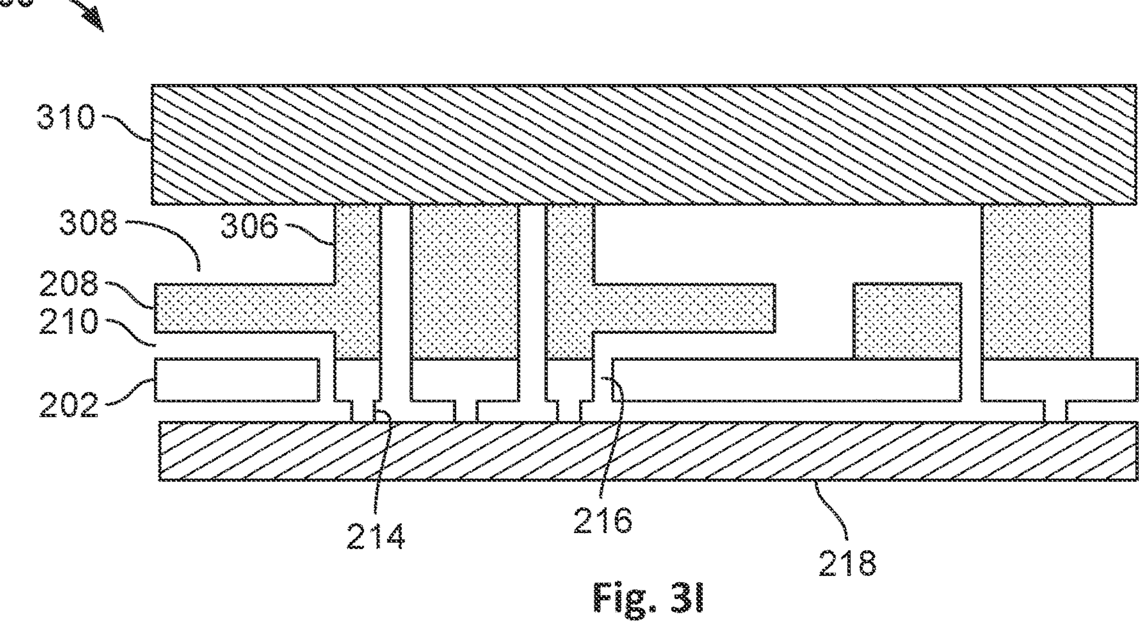
FIG. 3I depicts a step of a process for fabricating a multi-level MEMS sensor, including bonding to a substrate layer, in accordance with an embodiment of the present disclosure.

FIG. 3G depicts a step of a process for fabricating a multi-level MEMS sensor, including grinding and patterning a second surface of an actuator layer, in accordance with an embodiment of the present disclosure, FIG. 3H depicts a step of a process for fabricating a multi-level MEMS sensor, including patterning via a second surface of an actuator layer, in accordance with an embodiment of the present disclosure, and FIG. 3I depicts a step of a process for fabricating a multi-level MEMS sensor, including bonding to a substrate layer, in accordance with an embodiment of the present disclosure. FIG. 3G, FIG. 3H, and FIG. 3I proceed to show fabrication steps similar to FIG. 2E, FIG. 2F, and FIG. 2G, respectively, including the patterning of a second surface of the actuator layer 214, the removed actuator material 216 (e.g., for isolation of features of the patterned second surface of the actuator layer 214), and the bonding of a substrate layer 218 (e.g., a CMOS layer or a layer providing electrical interconnects to active electrical components) to the patterned second surface of the actuator layer 214. It will be understood that the modifications of the removed actuator material 216 depicted between FIG. 3 and FIG. 2 are included to illustrate various embodiments of the present disclosure. Although particular feature topologies are depicted in certain configurations for FIG. 3 and FIG. 2, features may be removed, modified, substituted, or added in certain embodiments. The patterning of a second surface of the actuator layer 214, the removed actuator material 216, and the bonding of a substrate layer 218 enhance the performance of the multi-level MEMS sensor 300 by the enablement of qualities such as multiplexed sensors, high-frequency signal recording, high-fidelity signal amplification, signal transposition to external devices, instantaneous system calibration, and modular performance capability.

Figure 4A:
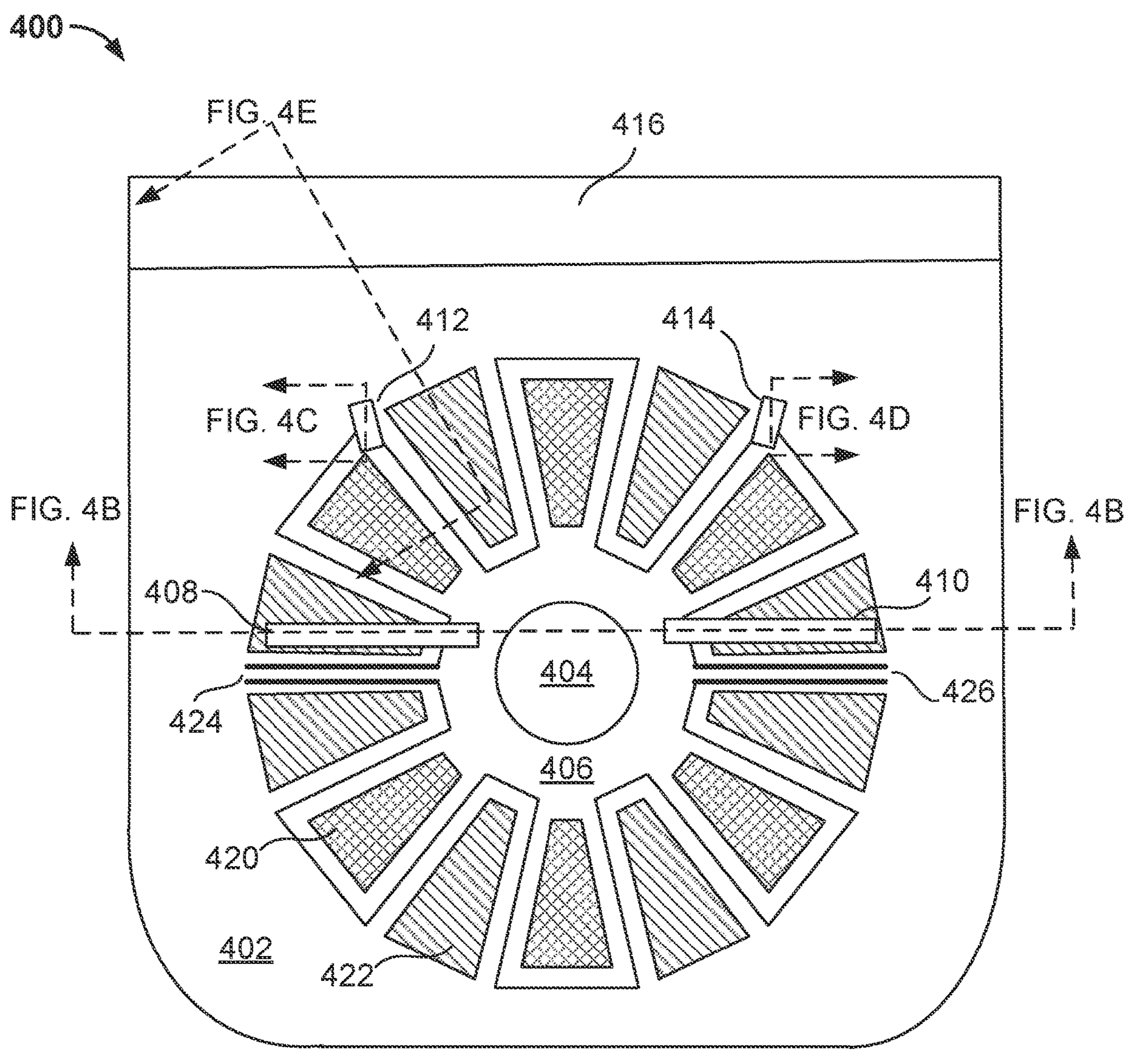
FIG. 4A depicts an exemplary MEMS accelerometer with multi-level features, in accordance with an embodiment of the present disclosure.

FIG. 4A depicts an exemplary MEMS accelerometer with multi-level features, in accordance with an embodiment of the present disclosure. MEMS sensor 400 may be, for example, an accelerometer, although the present disclosure applies to any MEMS sensor (e.g., gyroscopes, pressure sensors, etc.) in which multi-level features may be utilized. The view depicted in FIG. 4A is a simplified top view of an actuator layer of MEMS accelerometer 400, with numerous details and components excluded for ease of illustration. In some embodiments, the MEMS sensor 400 may include a MEMS layer that includes a movable portion 402 (e.g., a movable proof mass portion 402) and a fixed portion 406 (e.g., a fixed paddle portion 406). Cross hatching depicted in FIG. 4 corresponds to sense electrodes (e.g., paddle sense electrodes 420 and proof mass sense electrodes 422) located on an upper surface of a substrate below the MEMS layer (e.g., including a movable proof mass portion 402 and a fixed paddle portion 406). Although particular features and elements are depicted in certain configurations for FIG. 4, features and elements may be removed, modified, or substituted and additional features or elements may be added in certain embodiments.

An anchor 404 is fixed to a substrate and/or cap of the MEMS accelerometer, such that the position of the anchor is fixed relative to the substrate and portions of the MEMS layer fixedly attached to the anchor (e.g., fixed paddle portion 406) are similarly fixed with respect to the substrate. The MEMS layer of the MEMS sensor 400 includes a movable proof mass portion 402 that is coupled to the fixed paddle portion 406 such as via torsion springs 424 and 426. Movable proof mass portion 402 is unbalanced in the depicted embodiment, such that a linear acceleration along the z-axis in either direction causes a corresponding rotation of the movable proof mass portion 402 out of the plane defined by the MEMS layer at rest about the torsion springs, resulting in a portion of the movable proof mass portion 402 moving in the positive z-direction away from the substrate (and certain electrodes on the substrate) and a portion of the movable proof mass portion 402 moving in the negative z-direction towards the substrate (and certain other electrodes on the substrate).

It will be understood that when an acceleration is detected, for example, the MEMS layer may rotate about an axis of rotation (e.g., based on the orientation of torsion springs 424 and 426) that is out of plane relative to the plurality of sense electrodes, and the increase and decrease in capacitance may be processed by processing circuitry of the MEMS sensor 400 (e.g., via C2V circuitry, various filters, amplifiers, gain-offset-scaling circuitry, analog-to-digital converters, etc.) to determine acceleration. In accordance with the present disclosure, multi-level features are provided, including multi-level sensing features 408 and 410, multi-level bump stops 412 and 414, and multi-level weighted proof mass 416. The multi-level sensing features 408 and 410 are fixed relative to the out-of-plane movement of the proof mass, such that an increase and decrease in capacitance based on the movement of the proof mass relative to the multi-level sensing features 408 and 410 may be processed by processing circuitry of the MEMS sensor 200 (e.g., via C2V circuitry, various filters, amplifiers, gain-offset-scaling circuitry, analog-to-digital converters, etc.) to determine acceleration along with signals via the sense electrodes located on the substrate.

Figure 4B:
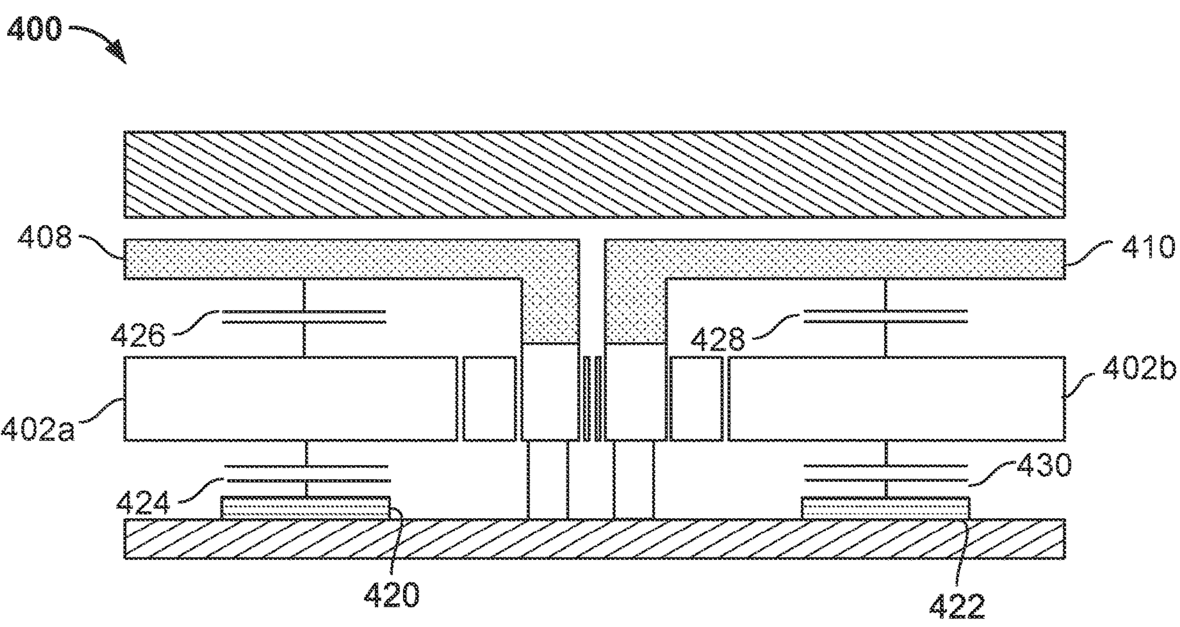
FIG. 4B depicts multi-level differential sensing of the multi-level MEMS sensor of FIG. 4A, in accordance with an embodiment of the present disclosure.

FIG. 4B depicts multi-level differential sensing of the multi-level MEMS sensor of FIG. 4A along section line 4B of FIG. 4A, in accordance with an embodiment of the present disclosure. Although particular features and interfaces are depicted in certain configurations for FIG. 4, features and interfaces may be removed, modified, or substituted, and additional features or interfaces may be added in certain embodiments. It will be understood that the multi-level MEMS sensor 400 embodies certain features that may result from certain fabrication steps illustrated in FIG. 2 and/or FIG. 3, corresponding to various embodiments of the present disclosure and without restricting related embodiments that are not explicitly illustrated.

In FIG. 4, the multi-level MEMS sensor 400 comprises a first multi-level sense feature 408 and a second multi-level sense feature 410 located above respective portions 402*a* and 402*b* of the proof mass 402. Based on the patterning of the actuator layer and connections to the substrate layer, the first multi-level sense feature 408 and a second multi-level sense feature 410 are electrically isolated from the proof mass 402, such that a first capacitor 426 is formed between first multi-level sense feature 408 and proof mass portion 402*a* and a second capacitor 428 is formed between second multi-level sense feature 420 and proof mass portion 402*b*. The proof mass 402 also forms capacitors with underlying sense electrodes 420 and 422, respectively, to form a third capacitor 424 between sense electrode 420 and proof mass portion 402*a* and to form a fourth capacitor 430 between sense electrode 422 and proof mass portion 402*b*.

Because proof mass 402 moves out of plane in response to a force of interest (e.g., a z-axis linear acceleration), the capacitors formed between the multi-level sense features and proof mass will change capacitance in a similar but opposite proportion to the capacitors formed between the sense electrodes and the proof mass. Thus, if proof mass portion 402*a* moves out-of-plane in the positive z-direction, the capacitance of capacitor 426 will increase in a similar proportion to a decrease in the capacitance of capacitor 424, if proof mass portion 402*a* moves out-of-plane in the negative z-direction, the capacitance of capacitor 426 will decrease in a similar proportion to an increase in the capacitance of capacitor 424, if proof mass portion 402*b* moves out-of-plane in the positive z-direction, the capacitance of capacitor 428 will increase in a similar proportion to a decrease in the capacitance of capacitor 430, and if proof mass portion 402*b* moves out-of-plane in the negative z-direction, the capacitance of capacitor 428 will decrease in a similar proportion to an increase in the capacitance of capacitor 430. Appropriate signal processing and scaling may be performed such that signals measured from the respective capacitors are properly scaled for further processing.

Figure 4C:
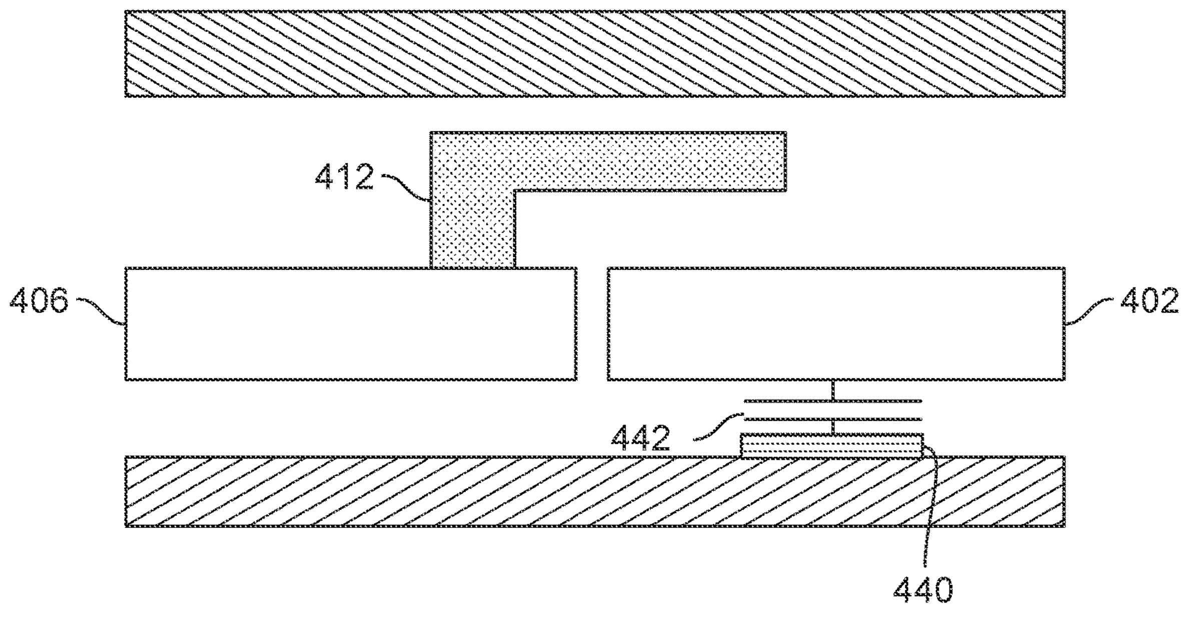
FIG. 4C depicts a paddle-based bump stop of the multi-level MEMS sensor of FIG. 4A, in accordance with an embodiment of the present disclosure.

FIG. 4C depicts a paddle-based bump stop of the multi-level MEMS sensor of FIG. 4A, in accordance with an embodiment of the present disclosure. A multi-level bump stop 412 extends from the handle 406 portion of the actuator layer above the proof mass 402 of the actuator layer. The proof mass in turn forms a capacitor 442 with a sense electrode 440. Although a multi-level bump stop 412 is located at a particular relative location on the x-y plane of the actuator layer, and a particular z-axis distance relative to the actuator layer, it will be understood that the depiction of FIGS. 4A and 4C is for illustration only, and that bump stops may be provided at numerous and varied locations and relative heights with respect to a proof mass such as proof mass 402. In the depiction of FIG. 4C, multi-level bump stop 412 is located above the proof mass 402 (e.g., at an edge of the proof mass likely to experience significant movement in response to a large undesired force or shock) to prevent excessive upward vertical movement of the proof mass 402 in response to an excessive force.

Figure 4D:
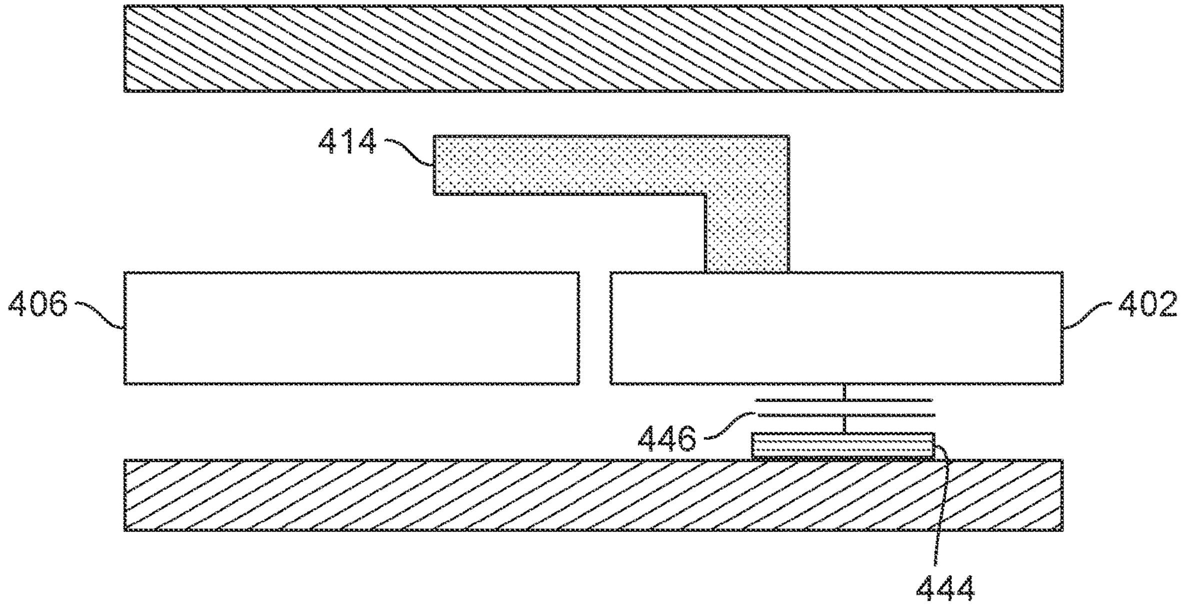
FIG. 4D depicts a proof mass-based bump stop of the multi-level MEMS sensor of FIG. 4A, in accordance with an embodiment of the present disclosure.

FIG. 4D depicts a proof mass-based bump stop of the multi-level MEMS sensor of FIG. 4A, in accordance with an embodiment of the present disclosure. A multi-level bump stop 414 extends from the proof mass 402 portion of the actuator layer above the proof mass paddle 406 portion of the actuator layer. The proof mass in turn forms a capacitor 446 with a sense electrode 444. Although a multi-level bump stop 414 is located at a particular relative location on the x-y plane of the actuator layer, and a particular z-axis distance relative to the actuator layer, it will be understood that the depiction of FIGS. 4A and 4D is for illustration only, and that bump stops may be provided at numerous and varied locations and relative heights with respect to a proof mass such as proof mass 402. Moreover, implementations of bump stops extending from both the paddle portion 406 (as depicted in FIG. 4C) and from the proof mass 402 (as depicted in FIG. 4D) can be included in the same implementation, for example, to provide bump stops in both directions of vertical proof mass movement at desired locations. In the depiction of FIG. 4D, multi-level bump stop 414 is located above the paddle 406 (e.g., at an edge of the proof mass 402 likely to experience significant movement in response to a large undesired force or shock) to prevent excessive downward vertical movement of the proof mass 402 in response to an excessive force.

In the embodiments of FIGS. 4C and 4D, the rigidity of the multi-level features may be tuned, such as by modifying processing conditions, material thicknesses, or by designing flexible structures to connect the stopper. In some embodiments, the multi-level features may facilitate easier device fabrication, such as by improved compatibility with CMOS foundry capabilities and/or reduced interfacial stiction.

Figure 4E:
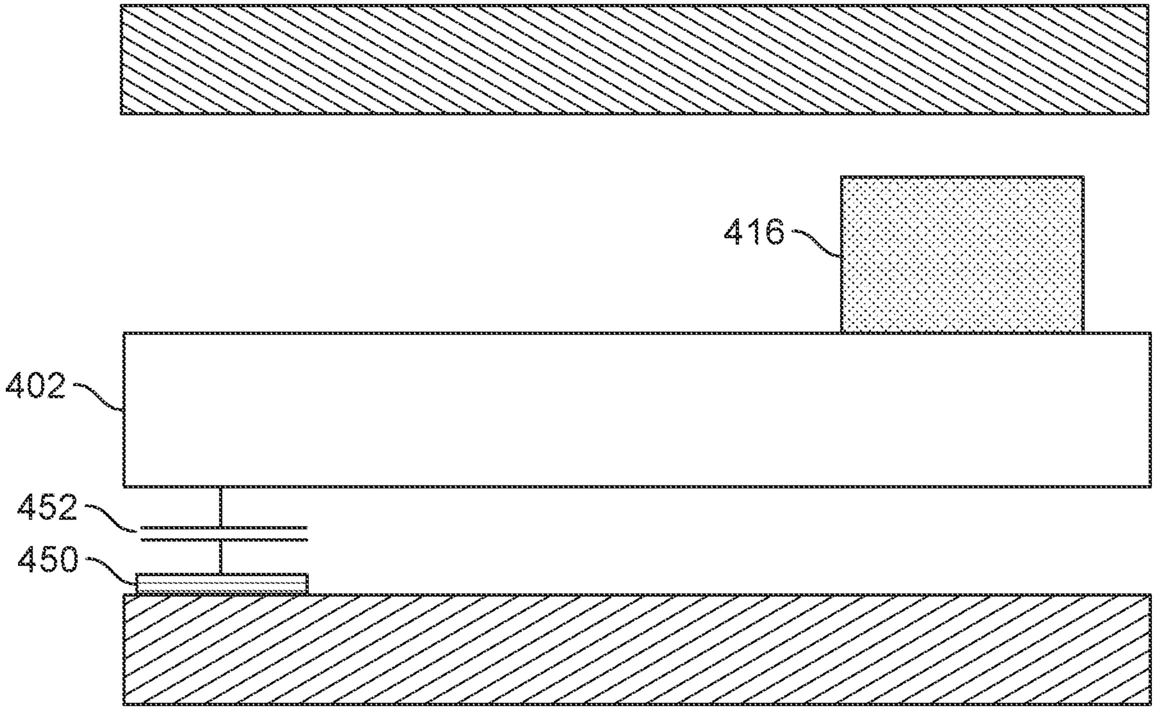
FIG. 4E depicts a weighted proof mass of the multi-level MEMS sensor of FIG. 4A, in accordance with an embodiment of the present disclosure.

FIG. 4E depicts a weighted proof mass of the multi-level MEMS sensor of FIG. 4A, in accordance with an embodiment of the present disclosure. Although a proof mass weight 416 is being depicted at a particular location and having a particular relative thickness, it will be understood that the proof mass weight can have a variety of suitable sizes and configuration (e.g., including internal cavities) in accordance with particular designs and required sensor responses. The proof mass weight 416 contributes additional mass to the proof mass 402 of the actuator layer, such as by coupling a certain volume of material with a certain density to the proof mass 402. A weighted proof mass may enable improved sensor sensitivity (e.g., at a capacitor 452 formed with sense electrode 450), such as by improving the inertial properties of the inertial electrical and mechanical components composing the microelectromechanical sensor system. The multi-level proof mass may enable improved sensor rejection of noise, offset, and drift, such as by mitigating adverse effects of thermal gradients that naturally arise across the working area of the MEMS device during operation of the MEMS device, due to more densely integrating the electrical and mechanical components composing the microelectromechanical sensor system.

Figure 5:
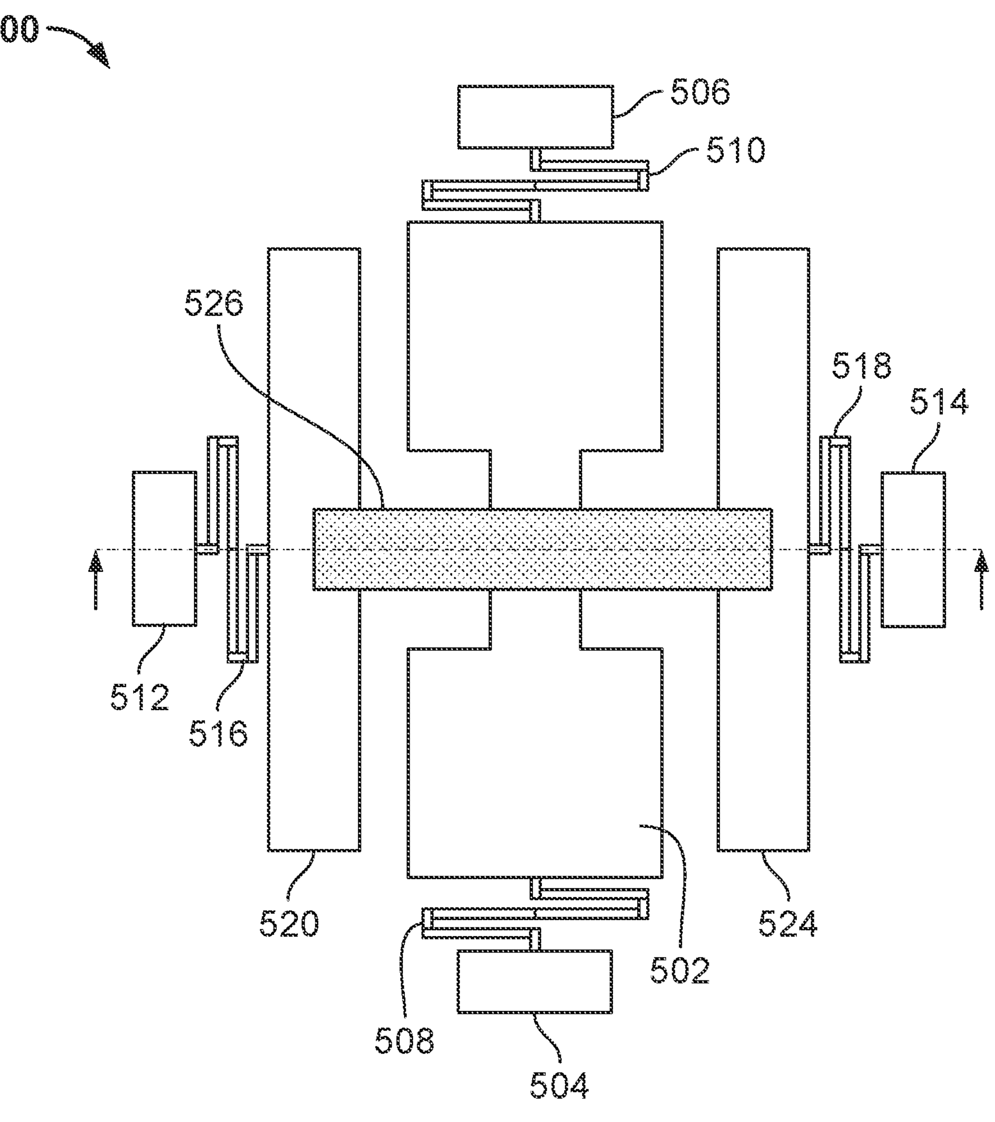
FIG. 5 depicts an exemplary proof mass bridge of a multi-level MEMS sensor, in accordance with an embodiment of the present disclosure.
Figure 5:
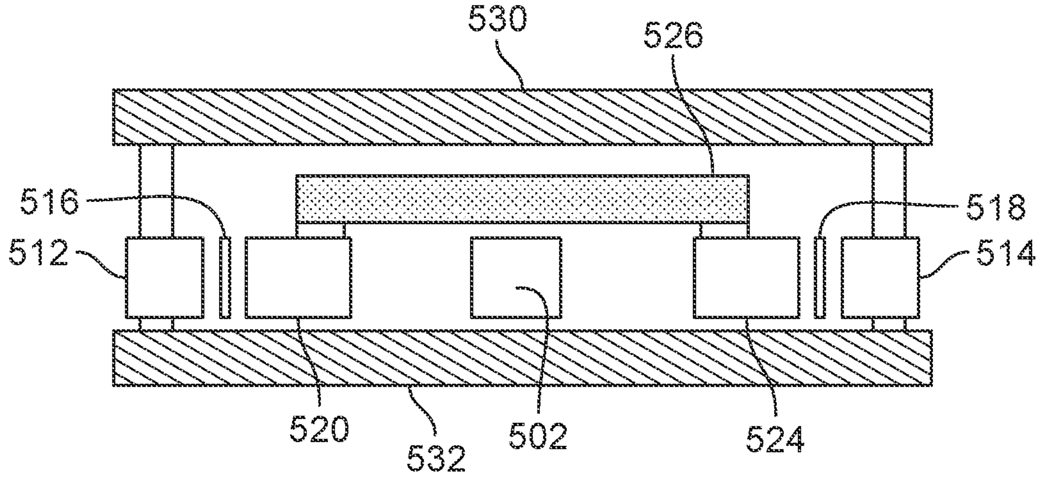

FIG. 5 depicts an exemplary proof mass bridge of a multi-level MEMS sensor, in accordance with an embodiment of the present disclosure. In accordance with the present disclosure, a bridging feature may connect two non-adjacent components, such as two or more movable masses (e.g., proof masses) or connecting one or more components to an anchor or anchored component. In this manner components may be connected where connection within the actuator layer would be impractical or would not provide desired functional characteristics. For example, bridging features may be used to synchronize movement of one or more movable components, to suspend components within an actuator layer, and/or to provide particular spring characteristics between components.

The upper image of FIG. 5 depicts a top view of a MEMS device with a bridging feature 526, as viewed from above (e.g., from the perspective of a cap layer above the actuator layer). A first mass 502 is connected to anchor 504 via spring 508 and to anchor 506 via spring 510. A second mass 520 is connected to anchor 512 via spring 516 and a third mass 524 is connected to anchor 514 via spring 518. It may be desirable to physically connect second mass 520 to third mass 524, such as to coordinate in-plane and/or out-of-plane movement of the proof masses in response to a force of interest. A bridging feature 526 may be fabricated to physically connect to the second mass 520 and third mass 524 and extend over first mass 502 without connecting to first mass 502 (e.g., extend upwards over first mass 502 in the direction of the cap).

As depicted in the section view (lower image) of FIG. 5, anchors 512 and 514 are physically anchored to a cap/handle layer 530 and substrate layer 532. First mass 520 is suspended from anchor 512 via spring 516 while second mass 524 is suspended from anchor 514 via spring 518. A center portion of first mass 502 is depicted between second mass 520 and third mass 524 making it impractical to directly physically connect second mass 520 to third mass 524 within the actuator layer. Accordingly, bridging feature 526 is fabricated such that it extends vertically from second mass 520 and third mass 524 in the direction of cap/handle layer 530, and over first mass 502 to connect between second mass 520 and third mass 524. In this manner, two movable masses (e.g., proof masses) can be coordinated to synchronize movements in response to forces of interest.

Although a single bridging feature is depicted in FIG. 5, it will be understood that multiple bridging features may connect to a single mass and/or anchor, facilitating a wide variety of movements and/or other desired characteristics, for example, functioning as 3-dimensional springs connected between and suspending or reinforcing components within the actuator layer.

Figure 6:
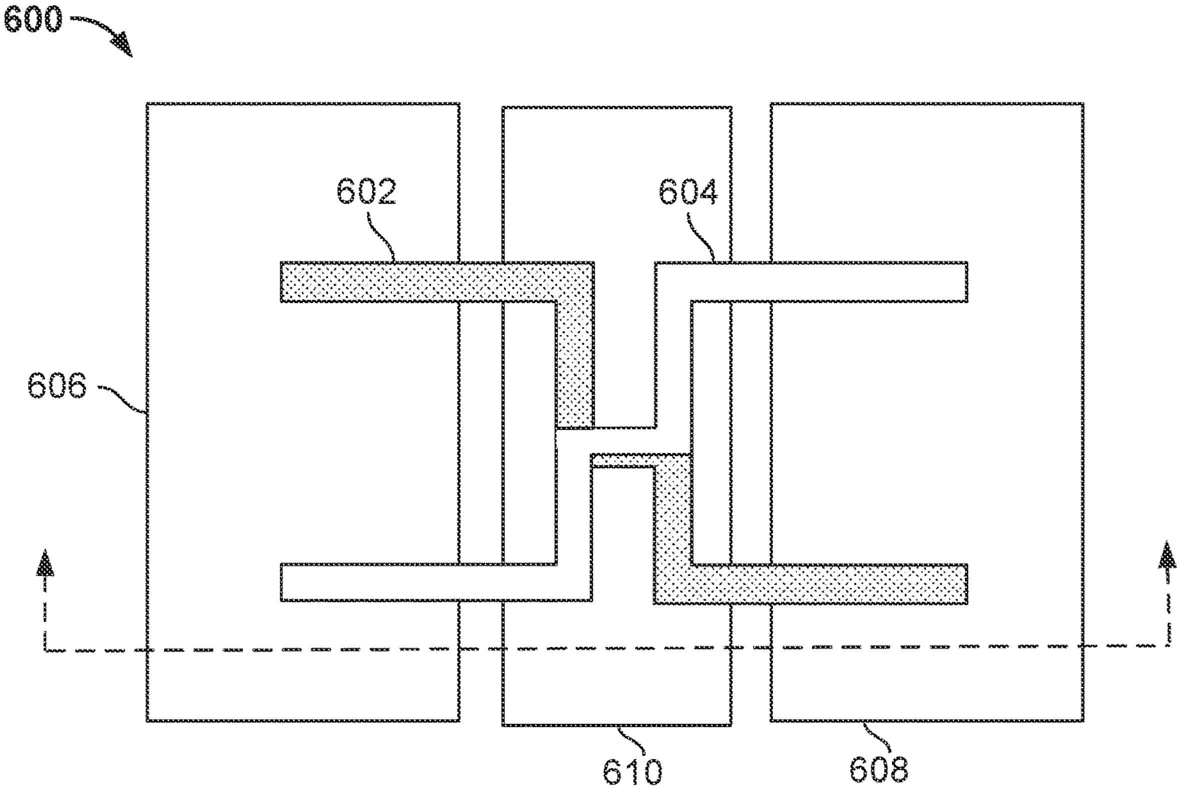
FIG. 6 depicts an exemplary multi-level proof mass bridge of a multi-level MEMS sensor, in accordance with an embodiment of the present disclosure.
Figure 6:
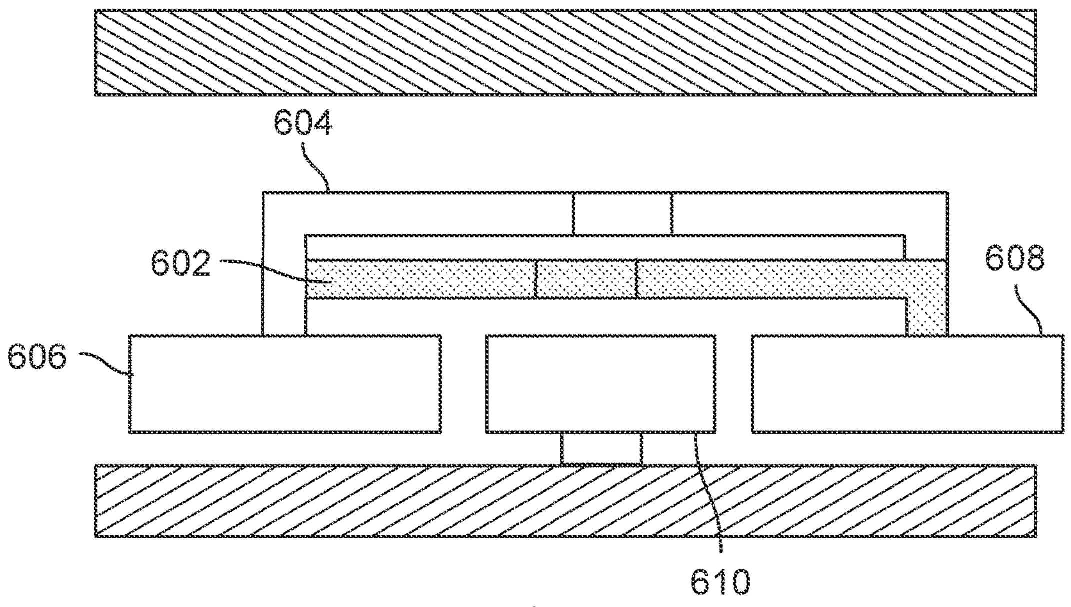

FIG. 6 depicts an exemplary multi-level proof mass bridge of a multi-level MEMS sensor, in accordance with an embodiment of the present disclosure. Although particular features and connections are depicted in certain configurations for FIG. 6, features and connections may be removed, modified, or substituted and additional features or connections may be added in certain embodiments. It will be understood that the multi-level MEMS sensors 600 embodies certain features that may result from certain fabrication steps illustrated in FIG. 2 and/or FIG. 3, corresponding to various embodiments of the present disclosure and without restricting related embodiments that are not explicitly illustrated. In some embodiments, feature isolation permits the multi-level MEMS sensor 600 to coincide on a single device with one or more of the multi-level MEMS sensors described herein, or related embodiments thereof, without compromising the features individually enabled by any one of the coinciding multi-level MEMS sensors.

In FIG. 6, multi-level MEMS sensor 600 comprises a first bridging feature 602 and a second bridging feature 604 which are grown from respective portions of an actuator layer that, after fabrication is completed, includes separate proof masses or proof mass portions 606 and 608. The top-down view of FIG. 6 shows how the bridging features 602 and 604 overlap in a lateral space which may compose a gap between respective regions of proof masses 606 and 608 that cannot include a linking component due to an intervening fixed mass 610. The side view of FIG. 6 shows the first bridging feature 602 vertically displaced from the second bridging feature 604, such that the features overlap in the lateral space while maintaining electrical and/or mechanical isolation from each other. It will be understood that the configuration of FIG. 6 is exemplary only, and will be dependent on the particular multi-level features being formed. Although FIG. 6 illustrates the second bridging feature 604 being above the first bridging feature 602, and the second bridging feature 604 being thinner than the first bridging feature 602 in the overlapping region between the two bridging structures, the feature sizes, stacking, and nature of bridging may be modified or substituted, and additional bridging features may be added in certain embodiments. The first bridging feature 602 and/or the second bridging feature 604 may enable improved sensor rejection of noise, offset, and drift, such as by existing in configurations that eliminate sensor sensitivity to out-of-plane mechanical vibrations, or such as by mechanically coupling structures to reduce sensitivity to highly localized mechanical vibrations. Although FIG. 6 illustrates the actuator layer as comprising two isolated proof masses 606 and 608, it will be understood that the actuator layer may represent a single MEMS device comprising one or more isolated active regions over a single bulk substrate (e.g., a chip).

Figure 7:
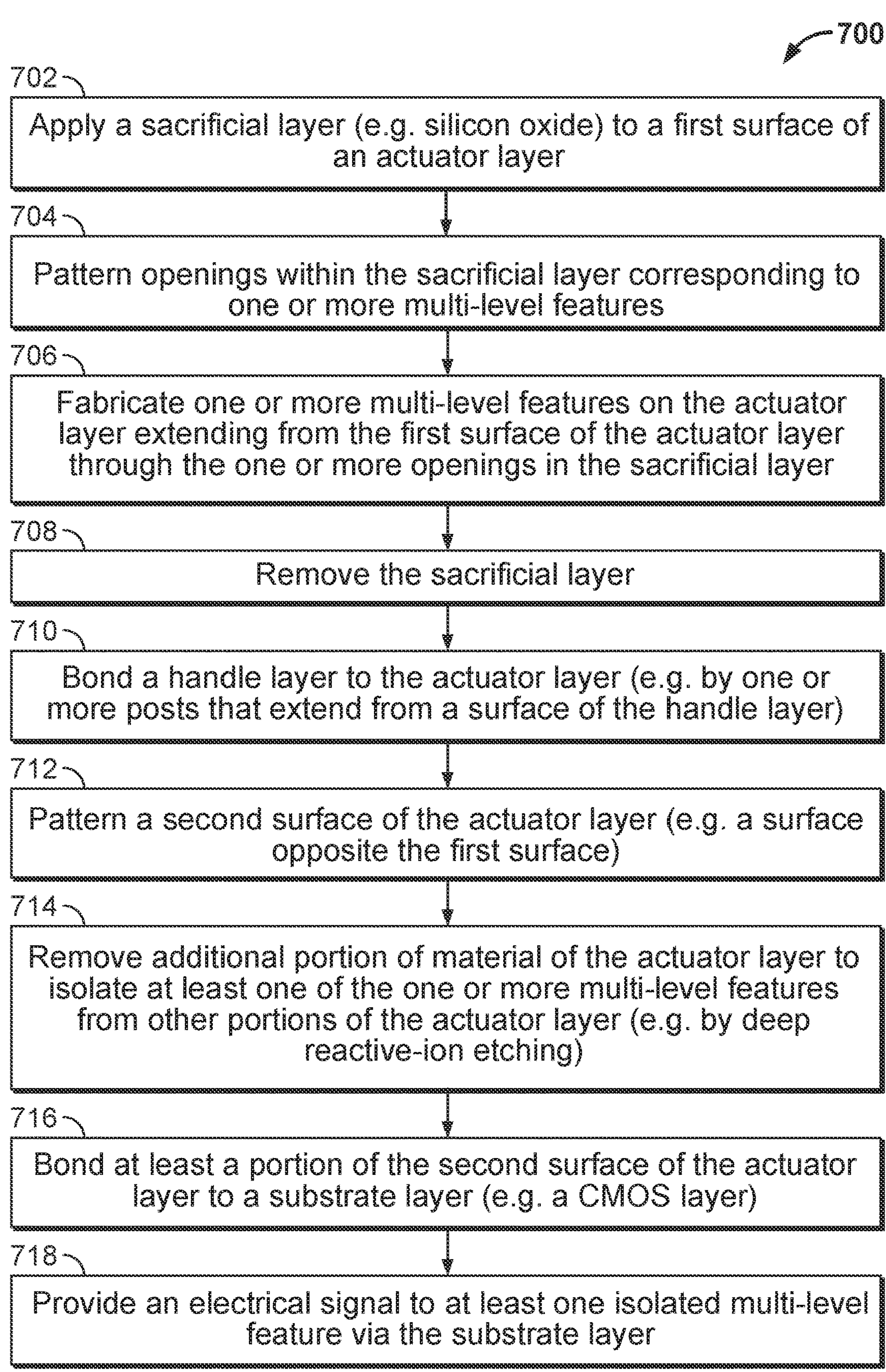
FIG. 7 depicts exemplary steps for fabricating multi-level features of a MEMS sensors, in accordance with an embodiment of the present disclosure.

FIG. 7 depicts exemplary steps 700 for fabricating multi-level features of a MEMS sensors, in accordance with an embodiment of the present disclosure. It will be understood that the fabrication procedure 700 is illustrative of certain steps that may result in certain topologies depicted in FIG. 2, corresponding to various embodiments of the present disclosure, without restricting related embodiments that are not explicitly illustrated. Although particular steps are depicted in a certain order for FIG. 7, steps and orders may be removed, modified, or substituted and additional steps may be added in certain embodiments.

At step 702, the sacrificial layer (e.g., 204) is applied to a first surface of an actuator layer (e.g., 202). This layer may be applied such as by chemical vapor deposition. Processing may then continue to step 704

At step 704, openings (e.g., 206) may be patterned in the sacrificial layer (e.g., 204), such as by photolithography and etching, to provide locations for fabrication of multi-level features on the actuator layer. Once the sacrificial layer is patterned, processing may continue to step 706.

At step 706, multi-level features (e.g., 208) may be fabricated on the actuator layer (e.g., 202) to extend through the openings (e.g., 206) in the sacrificial layer and to at least partially be deposited over portions of the sacrificial layer. These features may be fabricated, such as by epitaxial growth, and may be patterned, such as by chemical mechanical planarization and subsequent deep reactive-ion etching. This step 706 may result in a topology such as that as shown in FIG. 2B. The step 706 may enable benefits such as the ability to fabricate arbitrary three-dimensional features, which may improve sensor performance through qualities such as higher density, improved integration capability, improved sensitivity, improved protection of inertial components, and improved rejection of signal noise, offset, and drift. Once the multi-level features are fabricated, processing may continue to step 708.

At step 708, the sacrificial layer (e.g., 210) may be removed, such as by wet chemical etching. This step 708 may result in a topology such as that shown in FIG. 2C. The step 708 may enable benefits such as isolation of one or many of the multi-level features 208 and the creation of internal cavities in desired areas. Once the sacrificial layer is removed, processing may continue to step 710.

At step 710, the handle layer (e.g., 212) may be bonded to the actuator layer (e.g., 202), such as by one or more posts vertically extending from the surface of the handle layer (e.g., 220) to the first surface of the actuator layer or to the surface of the multi-level features. The layers may be bonded such as by fusion bonding. Step 710 may result in a topology such as that shown in FIG. 2D. Step 710, in some embodiments, may result in an intra-layer cavity between the actuator layer (e.g., 202) and one or more multi-level features (e.g., 208), and/or between the actuator layer (e.g., 202) and the handle layer (e.g., 212), and/or between one or more multi-level feature (e.g., 208) and the handle layer (e.g., 212). In some embodiments, the intra-layer cavity may provide electromechanical isolation of one or more features of the multi-level actuator. In other embodiments, the intra-layer cavity may provide an optimal environment (e.g., an ambient pressure or vacuum) for the operation of inertial mechanical components composing microelectromechanical sensors. The step 710 may incorporate one or more posts vertically extending from the surface of the handle layer (e.g., 220) to bond the otherwise-flat handle layer (e.g., 212) to a MEMS topology containing any arbitrary combination of one or more multi-level features (e.g., 208) occupying a device region that is effectively three-dimensional. Once the handle layer is bonded to the MEMS layer, processing may continue to step 710.

At step 712, the second surface of the actuator layer (e.g., 214) may be processed such as by grinding and patterning. This step 712 may result in a topology such as that shown in FIG. 2E. The step 712 may enable mechanically and electrically connecting the second surface of the actuator layer (e.g., 214) with a substrate layer (e.g., 218) as described herein. Processing may then continue to step 714.

At step 714, portion of the material composing the actuator layer (e.g., 202) may be removed to isolate regions of the actuator layer (e.g., 216). This material may be removed such as by deep reactive-ion etching. This step 714 may result in a topology such as that shown in FIG. 2F. The step 714 may enable electrically and/or mechanically decoupling subsequent individual connections between the second surface of the actuator layer (e.g., 214) and the substrate layer (e.g., 218), as described below. Processing may then continue to step 716.

At step 716, the substrate layer (e.g., 218) may be bonded to the second surface of the actuator layer (e.g., 214). This substrate layer may include electrical connections (e.g., may be a CMOS layer) between active electrical components and portions of the actuator layer. This layer may be bonded, such as by eutectic bonding or thermo-compression bonding. This step 716 may result in a topology such as that shown in FIG. 2G. The step 716 may enable integration of the MEMS device with integrated circuitry configured to execute processes such as signal readout, sensor configuration, system calibration, and noise, offset, and drift rejection. Processing may then continue to step 718.

At step 718, an electrical signal may be provided to at least one isolated multi-level feature (e.g., 208) via an isolated connection (e.g., 214, 216) to the substrate layer (e.g., 218). Step 718 may enable the integration of one or more multi-level MEMS sensors (e.g., as described herein) with an interconnected electrical system (e.g., CMOS) that actively controls or monitors the one or more multi-level MEMS sensor via electrical inputs or outputs.

Figure 8:
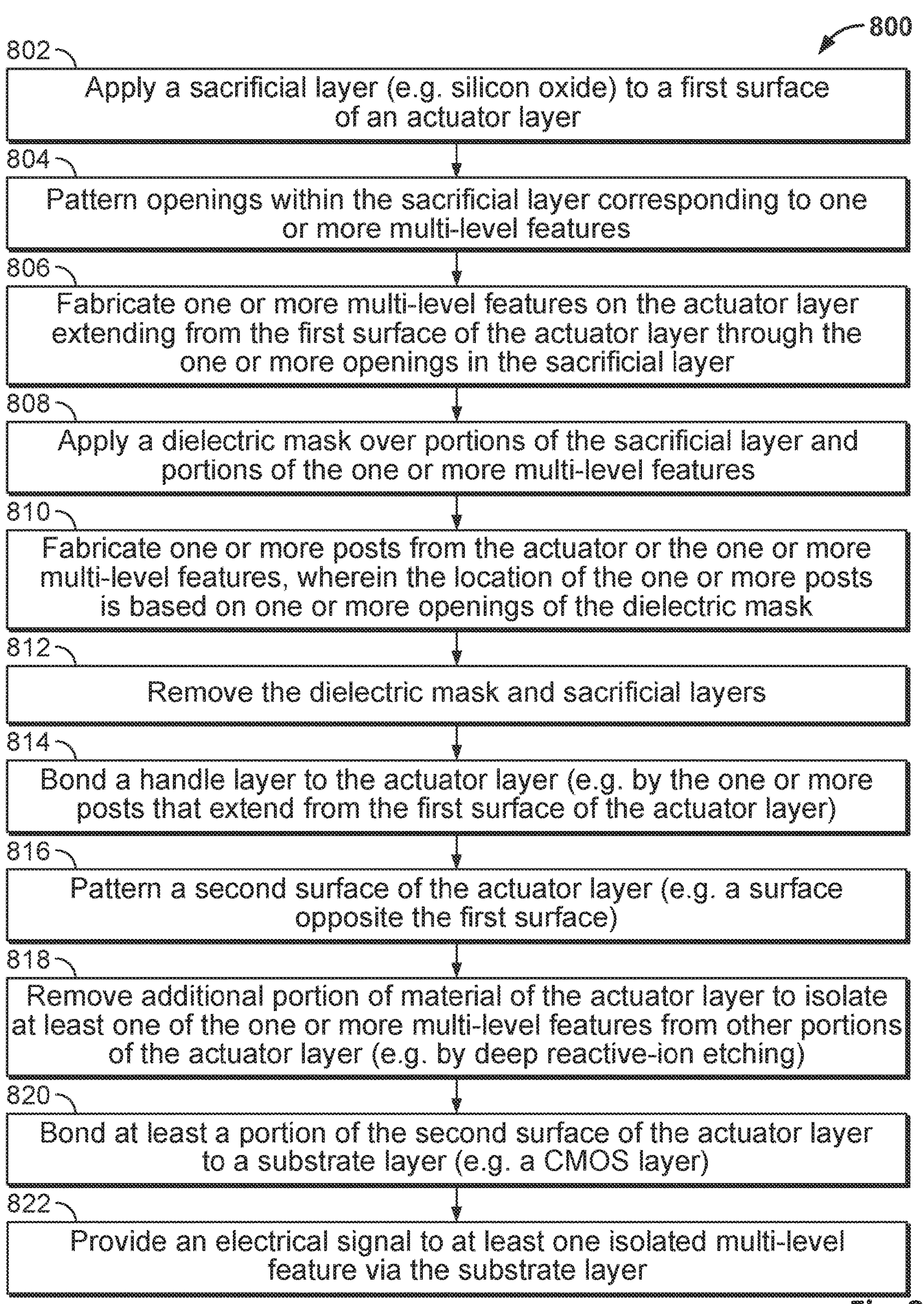
FIG. 8 depicts exemplary steps for fabricating multi-level features of a MEMS sensors, in accordance with an embodiment of the present disclosure.

FIG. 8 depicts exemplary steps for fabricating multi-level features of a MEMS sensors, in accordance with an embodiment of the present disclosure. Although the first three steps (e.g., 802, 804, and 806) correspond to steps of FIG. 6 (e.g., steps 602, 604, and 606) and the last four steps (e.g., 816, 818, 820, and 822) correspond to steps of FIG. 6 (e.g., steps 612, 614, 616, and 618), these steps may be removed, modified, or substituted and additional steps may be added in certain embodiments. It will be understood that the fabrication steps of FIG. 8 may correspond to certain topologies depicted in FIG. 3, corresponding to various embodiments of the present disclosure, without restricting related embodiments that are not explicitly illustrated. Although particular steps are depicted in a certain order for FIG. 8, steps and orders may be removed, modified, or substituted and additional steps may be added in certain embodiments.

At step 808, a dielectric mask (e.g., 302) is applied over selected regions of the sacrificial layer (e.g., 204) and the multi-level features (e.g., 208), with openings patterned in the dielectric mask (e.g., 304) corresponding to locations of further vertically extending multi-level features (e.g., 306) as described below. This dielectric mask may be applied, such as by chemical vapor deposition, and may be patterned, such as by photolithography and wet chemical etching. This step 808 may result in a topology such as that shown in FIG. 3C. Step 808 enables additional portions of the multi-level features (e.g., 208) to further vertically extend as described below (e.g., 306). Once the dielectric mask is applied, processing may continue to step 810.

At step 810, one or more multi-level posts (e.g., 306) that further vertically extend from the one or more previously fabricated multi-level features may be fabricated. These multi-level posts (e.g., 306) may be fabricated such as by epitaxial growth. This step 810 may result in a topology such as that shown in FIG. 3D. The step 810 may enable improved sensor performance of the multi-level MEMS sensor 300, such as by enabling a greater number of arbitrary three-dimensional configurations of the multi-level features (e.g., 208, 306). Once the posts are fabricated, processing may continue to step 812.

At step 812, the dielectric mask (e.g., 304) and the sacrificial layer (e.g., 204) may be removed to yield intra-layer cavities between the multi-level feature and the handle layer (e.g., 308), or between the multi-level feature and actuator layer (e.g., 210). This material may be removed such as by wet chemical etching. This step 812 may result in a topology such as that shown in FIG. 3E. Processing may then continue to step 814.

At step 814, the handle layer (e.g., 310) may be bonded to the actuator layer posts (e.g., 306). This layer may be bonded such as by fusion bonding. This step 814 may result in a topology such as that shown in FIG. 3F. The step 814 may enable the formation of one or many intra-layer cavities without requiring precise alignment of the top cavity surface (e.g., 310) and the other cavity surfaces (e.g., 306, 208, 202). The step 814 may enable improved fabrication capability of the multi-level MEMS sensor 300, and related embodiments thereof, such as by eliminating alignment requirements that may arise due to handle layer posts. The step 814 may therefore enable benefits such as higher-density device packaging and greater coverage of the total device area with active mechanical and/or electrical components. Once the actuator layer posts are bonded to the handle layer at step 814, processing may continue with steps 816 through 822 to complete fabrication of the MEMS sensor.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A method of fabricating a multi-level microelectromechanical system (MEMS) sensor, comprising:

providing an actuator layer;

applying a sacrificial layer to a first surface of the actuator layer, wherein one or more openings within the sacrificial layer correspond to one or more multi-level features;

fabricating the one or more multi-level features on the actuator layer, wherein the one or more multi-level features extend from the first surface of the actuator layer through the one or more openings in the sacrificial layer;

removing the sacrificial layer, wherein after removal of the sacrificial layer an intra-layer cavity separates a portion of the first surface of the actuator layer from the one or more multi-level features;

bonding a handle layer overlying the multi-level features to the actuator layer, wherein after the bonding of the handle layer a cavity is formed over the multi-level features; and bonding a substrate layer to at least a portion of a second surface of the actuator layer, wherein after the bonding of the substrate layer a patterned portion of the actuator layer is suspended over the substrate layer.

2. The method of claim 1, further comprising patterning, after the bonding to the handle layer, the second surface of the actuator layer to create the patterned portion.

3. The method of claim 2, further comprising grinding the second surface of the actuator layer to a target thickness prior to the patterning.

4. The method of claim 2, wherein the second surface of the actuator layer is located opposite the first surface of the actuator layer.

5. The method of claim 2, further comprising removing an additional portion of material of the actuator layer after the patterning to electrically and mechanically isolate at least one of the one or more multi-level features from other portions of the actuator layer.

6. The method of claim 5, wherein the additional portion of material of the actuator is removed by deep reactive-ion etching.

7. The method of claim 5, wherein the substrate layer comprises a complementary metal-oxide semiconductor (CMOS) layer.

8. The method of claim 5, wherein an electrical signal is provided to the isolated at least one multi-level feature via the substrate layer.

9. The method of claim 1, wherein the handle layer comprises one or more posts that extend in a direction of the first surface of the actuator layer to bond to the first surface of the actuator layer.

10. The method of claim 1, wherein the sacrificial layer comprises silicon oxide.

11. The method of claim 1, further comprising:

applying, prior to the removal of the sacrificial layer, a dielectric mask over portions of the sacrificial layer and portions of the one or more multi-level features; and fabricating one or more posts from the actuator layer or the one or more multi-level features, wherein a location of the one or more posts is based on one or more openings of the dielectric mask, and wherein the bonding of the handle layer to the actuator layer is via the one or more posts.

12. The method of claim 11, further comprising:

grinding the second surface of the actuator layer to a target thickness; and patterning, after the bonding to the handle layer and grinding, the second surface of the actuator layer to create the patterned portion.

13. The method of claim 12, further comprising removing an additional portion of material of the actuator layer after the patterning to electrically and mechanically isolate at least one of the one or more multi-level features from other portions of the actuator layer.

14. The method of claim 1, wherein at least one of the one or more multi-level features comprises a sense electrode located between the handle layer and a portion of the first surface.

15. The method of claim 1, wherein at least one of the one or more multi-level features comprises a bump stop located between the handle layer and a portion of the first surface.

16. The method of claim 1, wherein at least one of the one or more multi-level features comprises a weighted portion located between the handle layer and a portion of the first surface.

17. The method of claim 1, wherein at least one of the one or more multi-level features comprises a mechanical bridge structure located between the handle layer and a portion of the first surface, and wherein the mechanical bridge structure connects at least two portions of the actuator layer.

18. The method of claim 1, wherein bonding the handle layer comprises bonding the handle layer to the one or more multi-level features on the actuator layer.

* * * * *